US006882567B1

(12) United States Patent
Wong

(10) Patent No.: US 6,882,567 B1
(45) Date of Patent: Apr. 19, 2005

(54) PARALLEL PROGRAMMING OF MULTIPLE-BIT-PER-CELL MEMORY CELLS ON A CONTINUOUS WORD LINE

(75) Inventor: Sau Ching Wong, Hillsborough, CA (US)

(73) Assignee: Multi Level Memory Technology, Reno, NV (US)

( * ) Notice: Subject to any disclaimer, the term of this patent is extended or adjusted under 35 U.S.C. 154(b) by 210 days.

(21) Appl. No.: 10/313,076

(22) Filed: Dec. 6, 2002

(51) Int. Cl.[7] .......................... G11C 16/04; G11C 16/06
(52) U.S. Cl. ......................... 365/185.03; 365/185.22; 365/185.24
(58) Field of Search ...................... 365/185.03, 185.11, 365/185.18, 185.22, 185.24, 185.33

(56) References Cited

U.S. PATENT DOCUMENTS

| | | | | |
|---|---|---|---|---|
| 5,596,527 A | * | 1/1997 | Tomioka et al. ....... | 365/185.03 |
| 5,751,635 A | * | 5/1998 | Wong et al. .......... | 365/185.03 |
| 6,104,636 A | * | 8/2000 | Tada ..................... | 365/185.03 |
| 6,259,627 B1 | * | 7/2001 | Wong .................... | 365/185.22 |

\* cited by examiner

*Primary Examiner*—Trong Phan
(74) *Attorney, Agent, or Firm*—David T. Millers

(57) ABSTRACT

Write operations that simultaneously program multiple memory cells on the same word line in an MBPC Flash memory employ word line voltage variation, programming pulse width variation, and data-dependent bit line and/or source line biasing to achieve uniform programming accuracy across a range of target threshold voltages. A first type of write operations reaches different target threshold voltages during different time intervals, but uses word line signals that optimize threshold voltage resolution regardless of the target threshold voltage. A second type uses bit line and/or source line biases that depend on the multi-bit data values being written so that different memory cells reach different target threshold voltage at about the same time. Source line biasing can also reduce bit line leakage current through unselected memory cells during read or verify operations. A memory includes divided source lines that permit separate data-dependent source biasing. During or at the end of write operations, remedial programming sequences can adjust the threshold voltages of memory cells that program slowly.

22 Claims, 25 Drawing Sheets

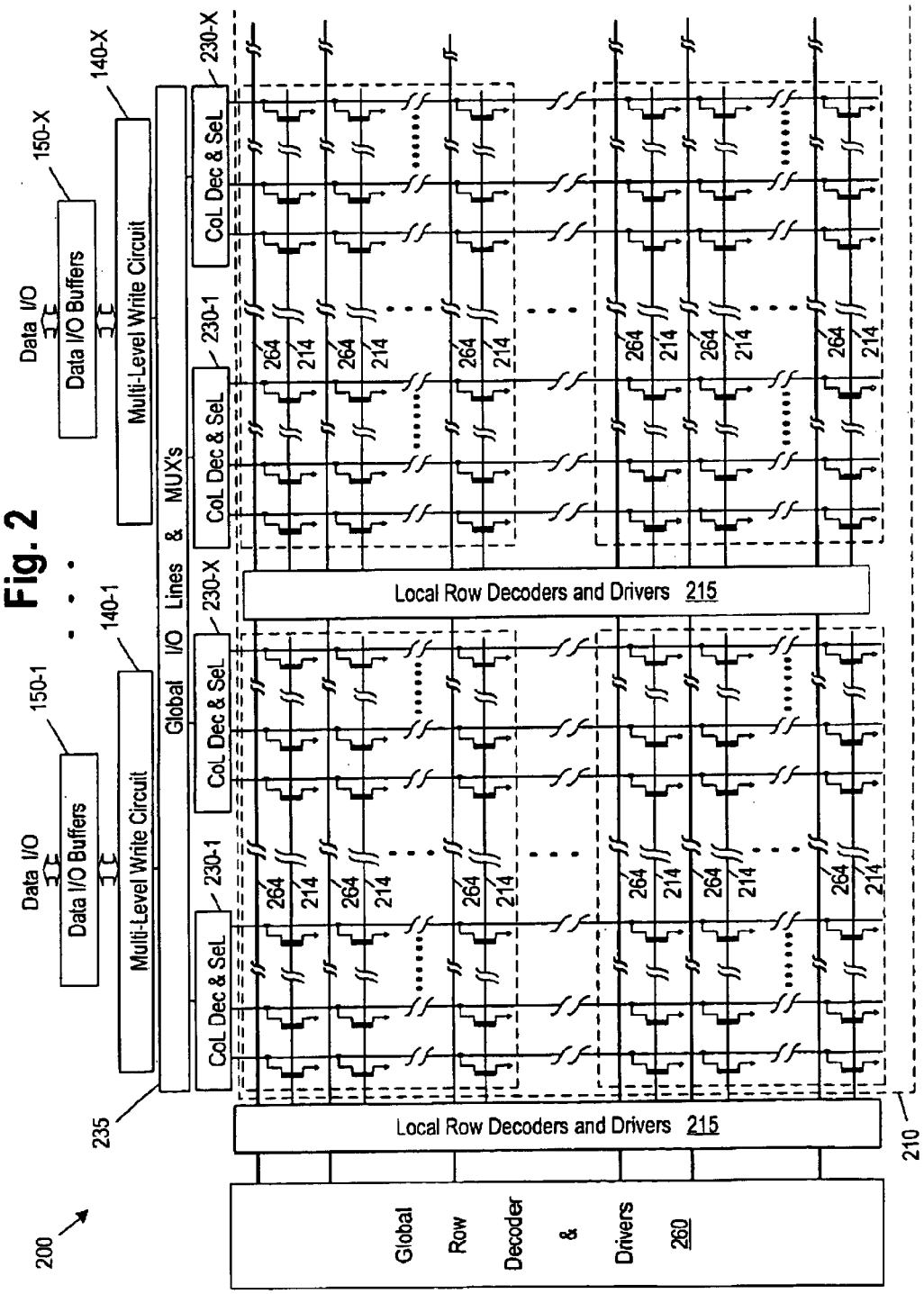

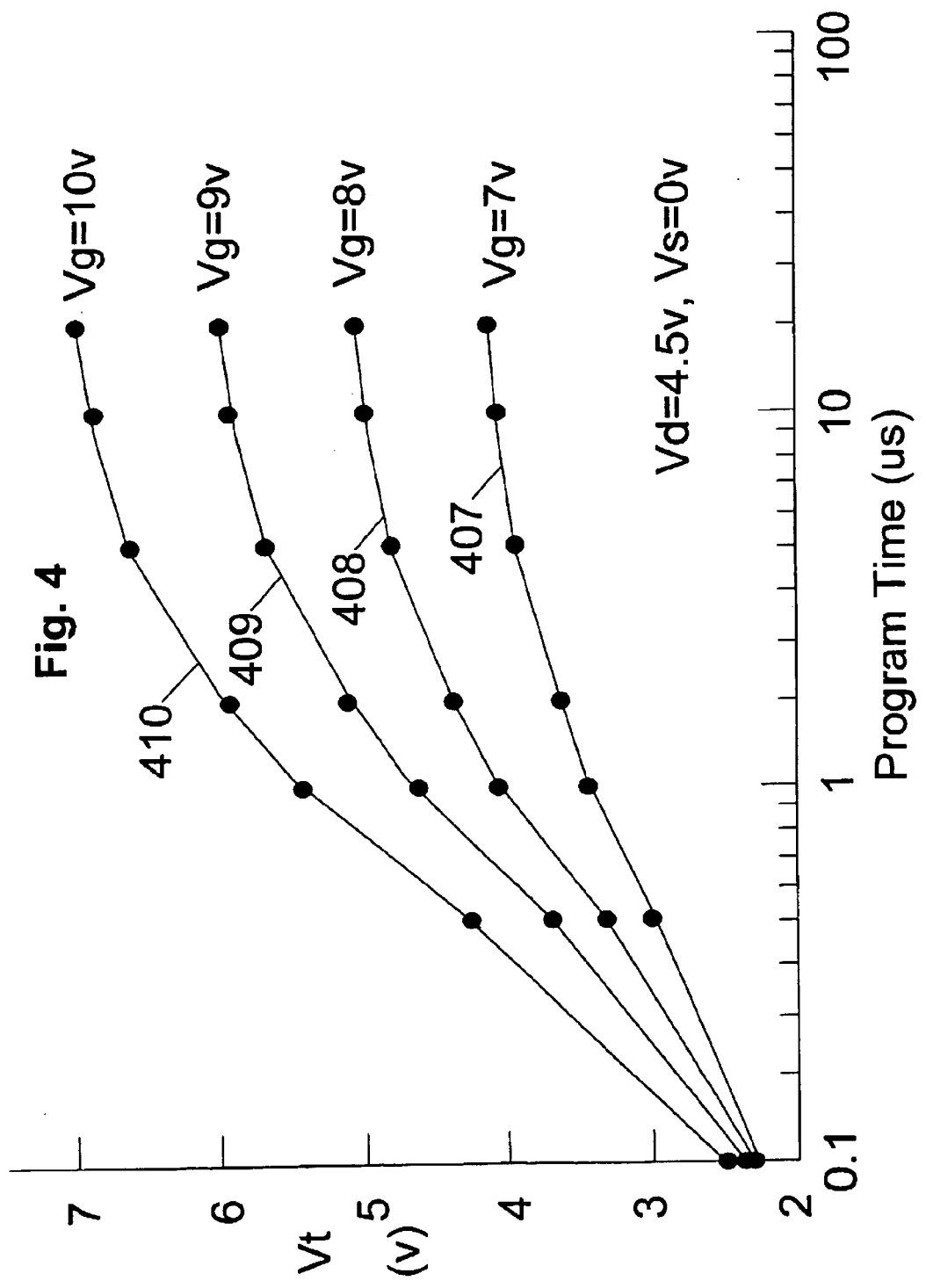

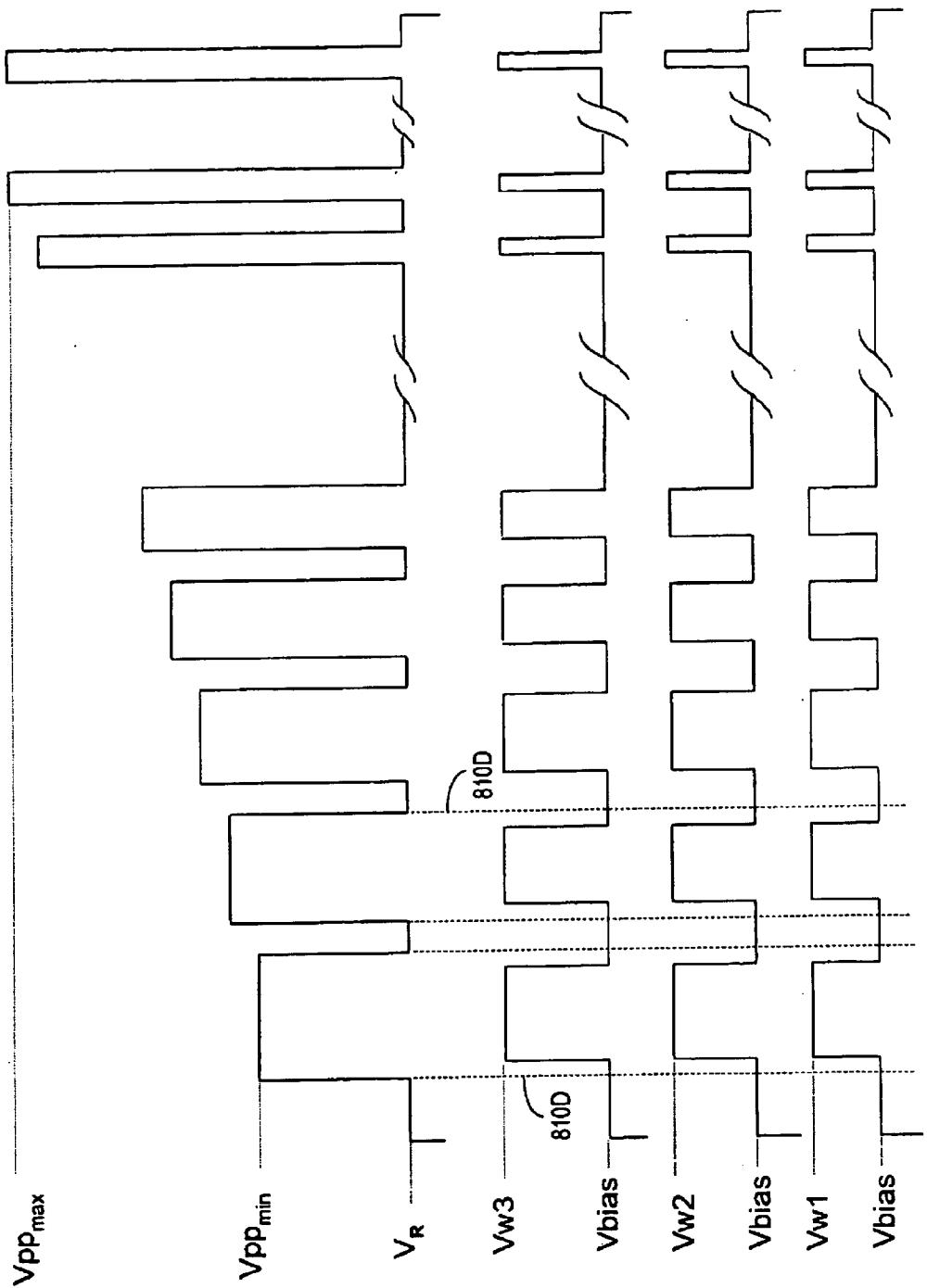

PARALLEL PROGRAMMING OF MULTIPLE-BIT-PER-CELL MEMORY CELLS ON A CONTINUOUS WORD LINE

BACKGROUND

Many memory manufacturers are developing multiple-bit-per-cell (MBPC) memories to increase storage density and lower memory cost. MBPC Flash memories, for example, have greater storage density than do binary memories because MBPC Flash memory cells are substantially the same as the binary Flash memory cells but each MBPC memory cell stores multiple data bits. MBPC Flash memories, however, require write and read circuits that can precisely set and sense the threshold voltages of the memory cells.

One goal for MBPC memories is to achieve the required precision for writing and reading data while still providing acceptable performance. Achieving the desired speed and accuracy for writing data in a Flash memory can be particularly difficult since the time required to program a memory cell to a target threshold voltage generally depends on the difference between the target threshold voltage and the threshold voltage of the erased state. Programming to a high threshold voltage from the erased state generally takes more time than does programming to a lower threshold voltage if the same programming parameters are employed for both programming operations. For example, a word line programming voltage Vpp that is high enough to program a memory cell to the highest threshold voltage state within an available time budget, will program a memory cell to a lower threshold voltage state in much less time than the available time budget. The programming accuracy of the lower threshold voltage is generally poor because the programming induces fast changes in the threshold voltage that can overshoot the lower threshold voltage.

One technique that improves programming accuracy for the lower target threshold voltages adjusts the word line voltage Vpp according to the data value being programmed. A higher word line programming voltage Vpp can program a memory cell to the highest target threshold voltage with a time approaching the limits of the available programming time budget. A lower word line programming voltage Vpp can similarly program a memory cell to a lower target threshold voltage in a time about equal to the available programming time budget. Varying the word line voltage according to the multi-bit data value provides good accuracy during programming since the programming rate (i.e., the change in threshold voltage per time) is minimized for each data value.

Varying word line voltage Vpp according to the multi-bit data value is difficult in MBPC memories having continuous word lines because typically multiple memory cells associated with the same word line must be simultaneously programmed to achieve an acceptable data rate. For example, a 2-bit-per-cell memory with a 32-bit data path generally programs 16 memory cells in parallel to provide an acceptable write speed. Programming methods that require word line voltages that vary according to a multi-bit data value are unsuited for parallel programming of two or more memory cells on the same word line because different memory cells are generally programmed in parallel to different multi-bit data values. Accordingly, such MBPC Flash memory architectures must either sacrifice write speed to achieve programming accuracy especially for the lower threshold voltage targets or sacrifice programming accuracy (especially for lower target threshold voltages) to achieve the desired write speed. Such sacrifices make increasing the number of storage bits per memory cell difficult and therefore hamper increases in storage density.

Programming methods and circuits that provide high write speeds and high programming accuracy are sought.

SUMMARY

In accordance with an aspect of the invention, write operations for MBPC Flash memories having continuous word lines achieve uniform programming accuracy across a wide range of target threshold voltages by employing combinations of word line voltage variation, programming pulse width variation, column line loading that depends on multi-bit data, and source line biasing that depends on multi-bit data.

A first type of write operations reaches different target threshold voltages during different time intervals. For an N-bit per cell memory the available programming time can be divided into $2^N$ or $(2^N-1)$ intervals, depending on whether the erased threshold voltage corresponds to a data value. Programming voltages are selected for each time interval so that the slowest-programming memory cells reach target threshold voltages just before the ends of the corresponding intervals. Generally, the programming voltage Vpp on the word line increases from one interval to the next and can either be constant during each interval or can increase during each interval. Programming cycles can be of a fixed duration or alternatively have their longest duration at the start of each interval and their shortest duration at the end of each interval. With this type of write operation, multiple memory cells on the same word line can be programmed to different target threshold voltages and reach their respective target threshold voltages in different time intervals.

A second type of write operations uses the same word line signal for programming multiple memory cells connected to the same memory cells but uses column line and/or source line biasing that depends on the multi-bit data values being written so that different memory cells reach different target threshold voltages at about the same time (e.g., within the available programming time budget.)

A third type of write operations combines features of the first and second types. In particular, drain and/or source line biasing depends on the multi-bit data being written, but programming voltages are selected so that different target threshold voltages are reached at different times. In one embodiment of a write operation for a (N+M)-bit per cell memory, the available programming time can be divided into $2^N$ intervals, and the programming raises threshold voltage to reach $2^M$ of the $2^{N+M}$ target threshold voltages during each interval. The multi-bit-data-dependent column line loading and/or source line biasing are selected so that all $2^M$ target threshold voltages are reached near the end of the interval. In another embodiment, the write operation reaches the $2^N$ lowest target threshold voltages during the respective $2^N$ time intervals, and uses the full available programming time budget for the remaining higher target threshold budgets.

Remedial programming sequences can be used in these write operations to adjust the threshold voltages of memory cells that are slow to program to the target threshold voltage.

BRIEF DESCRIPTION OF THE DRAWINGS

FIG. 2 shows MBPC Flash memory architecture having continuous global word lines and continuous local word lines.

FIG. 4 contains plots illustrating the effect of control gate voltage on the change in threshold voltage with accumulated programming time for a Flash memory cell.

FIGS. 8A, 8B, and 8D contain timing diagrams for alternative embodiments of write operations using data-dependent column and/or source line programming voltages to equalize the programming time required to reach different target threshold voltages.

Use of the same reference symbols in different figures indicates similar or identical items.

DETAILED DESCRIPTION

In accordance with an aspect of the invention, a MBPC Flash memory having continuous word lines implements write operations that set multiple threshold voltages when simultaneously programming multiple memory cells that are connected to the same word line. In one embodiment of the invention, a write operation reaches different target threshold voltages near the ends of corresponding time intervals, and the programming voltages and/or the duration of programming cycles during the write operation change to provide uniform threshold voltage resolution for the target threshold voltages. In another embodiment of the invention, memory cells being programmed have drain and/or source biasing that depend on the target threshold voltages for the memory cells so that the memory cells reach their respective threshold voltages at about the same time. In yet another embodiment of the invention, the write operation reaches multiple target threshold voltages at the ends of multiple time intervals. Accordingly, drain biasing and/or source biasing depend on the target threshold voltage and on the time interval during which the write operation reaches the target threshold voltage.

In accordance with another aspect of the invention, a write operation includes remedial programming cycles that are only applied to memory cells that program slowly. The remedial programming cycles can be applied at the end of a normal write operation for typical memory cells or at the ends of time intervals within the write operation when a sensing operation indicates a memory cell failed to reach its target threshold voltage. The remedial programming cycles can be of long duration or have high word line (gate) and/or column line (drain) programming voltages.

Figure 1:
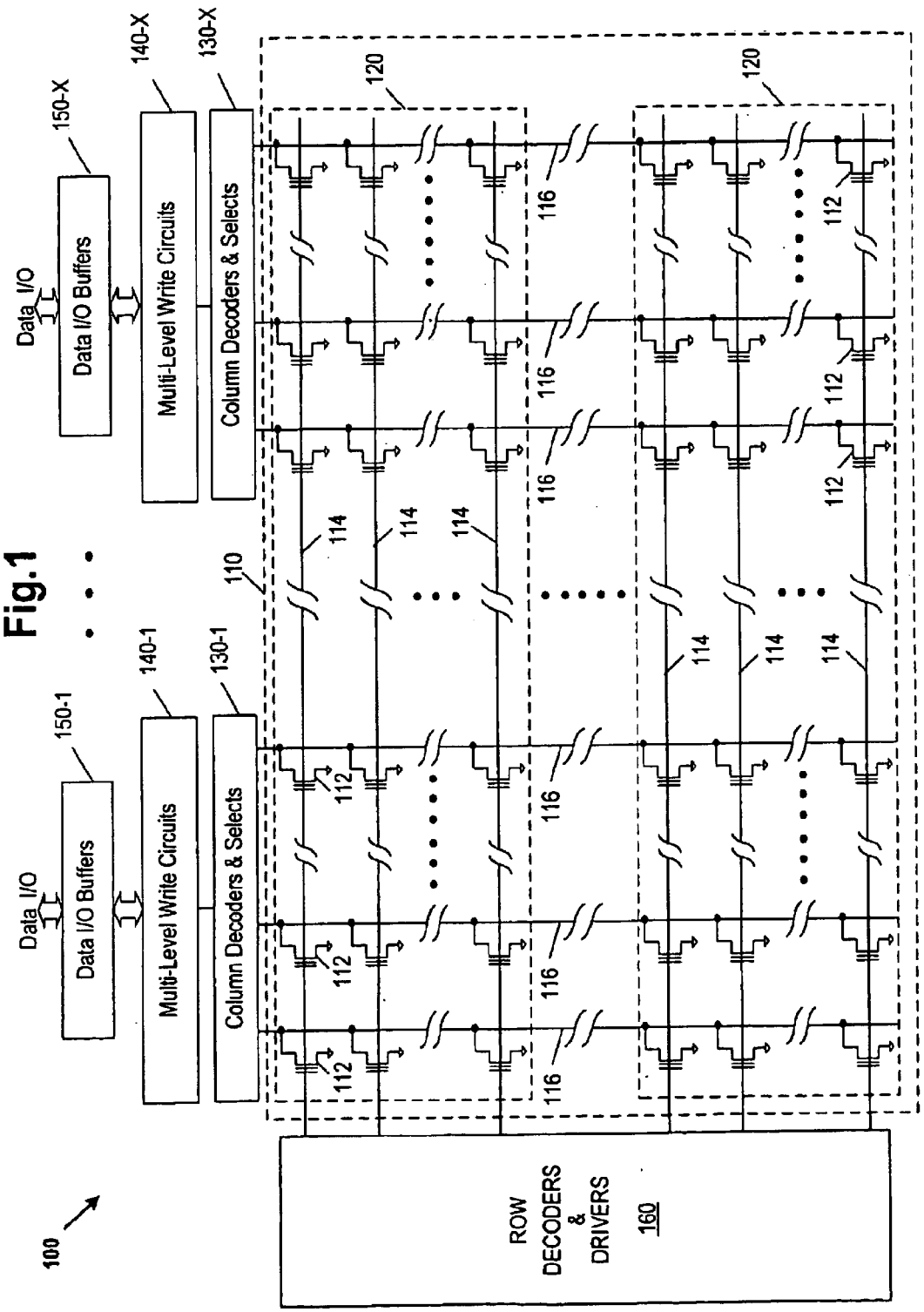
FIG. 1 shows MBPC Flash memory architecture having continuous word lines.

FIG. 1 shows programming circuitry in a MBPC Flash memory 100 including a memory array 110 with continuous word lines 114 connected to row decoders and drivers 160. Memory array 110 includes memory cells 112 that can be conventional floating gate transistors or any non-volatile memory cell capable of representing data as a programmable threshold voltage. Memory cells 112 in array 110 are arranged in rows and columns. Each row of memory array 110 contains memory cells 112 with gates connected to the word line 114 corresponding to the row. Word lines 114 are generally fabricated as polysilicon or silicide lines with portions of the word lines 114 forming the control gates of floating gate transistors that are memory cells 112. Each column of memory array 110 contains memory cells having drains connected to a column line (or bit line) 116 corresponding to the column. Column lines 116 can include diffused lines or metal lines with contacts to diffused drain regions depending on whether memory array 110 has a contactless architecture or not.

Memory cells 112 are further divided into separately erasable sectors 120 in array 110, and the sources of memory cells 112 in a sector 120 are connected to one or more source lines (not shown). Through the associated source line, a virtual ground device (not shown) can commonly bias the sources of memory cells 112 in a sector 120 to near ground potential for a read or verify operation. The sources of memory cells 112 in a sector 120 typically float during an erase operation that erases all memory cells 112 in the sector 120. The erase operation for a sector is preferably such that at the end of the erase operation all memory cells 112 in that sector have threshold voltages with a narrow window around a target threshold voltage for the erase operation. Tight control of the erased threshold voltage of memory cells 112 is desired because the highest threshold voltage of the erased memory cells provides a lower bound that limits the dynamic threshold voltage range available for storing multi-bit data. Further, the lowest threshold voltage of the erased memory cells must be controlled to prevent "over-erased" memory cells from causing bit line leakage current. A narrow window for the erased threshold voltages also improves the consistency of write operations and is particularly important if the erased threshold voltage corresponds to one of the multi-bit data values. Known intelligent/verified erase operations can employ remedial programming of any over-erased memory cells to provide a narrow threshold voltage distribution for erased memory cells.

MBPC Flash memory 100 has an input/output data path that includes more bits than can be stored in a single memory cell. For example, each memory cell 112 stores an N-bit value, where N is 2 or more, but the input/output data path is M bits wide, where M may be, for example, 16, 32 or more bits wide. Memory 100 has X column decoders 130-1 to 130-X, where X is the ratio of M to N. In response to a column address, each column decoder 130-1 to 130-X selects a different column line 116 for an access (read or write) operation, and for a write operation connects a corresponding multilevel write circuits 140-1 to 140-X to the selected column line. Accordingly, the column address causes selection of X columns for simultaneous access.

Multilevel write circuits 140-1 to 140-X control the voltages on the selected column lines to program selected memory cells 112 and sense whether the selected memory cells have been programmed to the target threshold voltages corresponding to the N-bit data values being written. Data I/O buffers 150-1 to 150-X store the N-bit values that are to be written in the selected memory cells, and write circuits 140-1 to 140-X control the sensing operation (e.g., select a reference signal for comparison during sensing) and/or select the column line biases or loads for programming according to the respective N-bit data values from data buffers 150-1 to 150-X.

FIG. 2 is a block diagram of a MBPC memory 200 having multiple local arrays 210. Each local memory array 210 can have the same architecture as memory array 110 of FIG. 1 and contains rows and columns of memory cells 112 that can be identical to memory cells 112 in memory 100. Memory cells 112 in a row of a local array 210 have control gates coupled to a local word line 214 corresponding to the row. Local word lines 214 are continuous within each local array 210, but are isolated from local word lines 214 in the other local arrays 210. Local row decoders 215 connect to local word lines 214 and select local word lines for read and write operations when the associated local array 210 is selected for access.

Continuous global word lines 264 connect local row decodes 215 to global row decode and driver circuits 260. In memory 200, global row circuits 260 include drivers that control the voltages on the selected global word line 264, and a selected one of the local row decoders 215 applies the voltage from the selected global word line 264 on the selected local word line 214. In an alternative architecture, local row decoders 215 contain driver circuits that drive the selected local word line 214 in the selected local array when the corresponding global word line 264 is active.

Memory cells 112 in a column of a local array 210 have drains connected to a column line 216 corresponding to the column. Each column line 216 connects to one of the local column decoders 230-1 to 230-X for the local array 210 containing the column line. Local column decoders 230-1 to 230-X in turn connect to global I/O lines and multiplexers 235 that select one of local arrays 210 for an access. For a write operation, global I/O lines and multiplexers 235 connect multilevel write circuits 140-1 to 140-X to respective local column decoders 230-1 to 230-X in the selected local array 210. Data I/O buffers 150-1 to 150-X store X independent N-bit data values for the write operation, and a write operation in memory 200 simultaneously writes the N-bit data values from data I/O buffers 150-1 to 150-X to selected memory cells 112 in the selected local array 210.

Figure 3A:
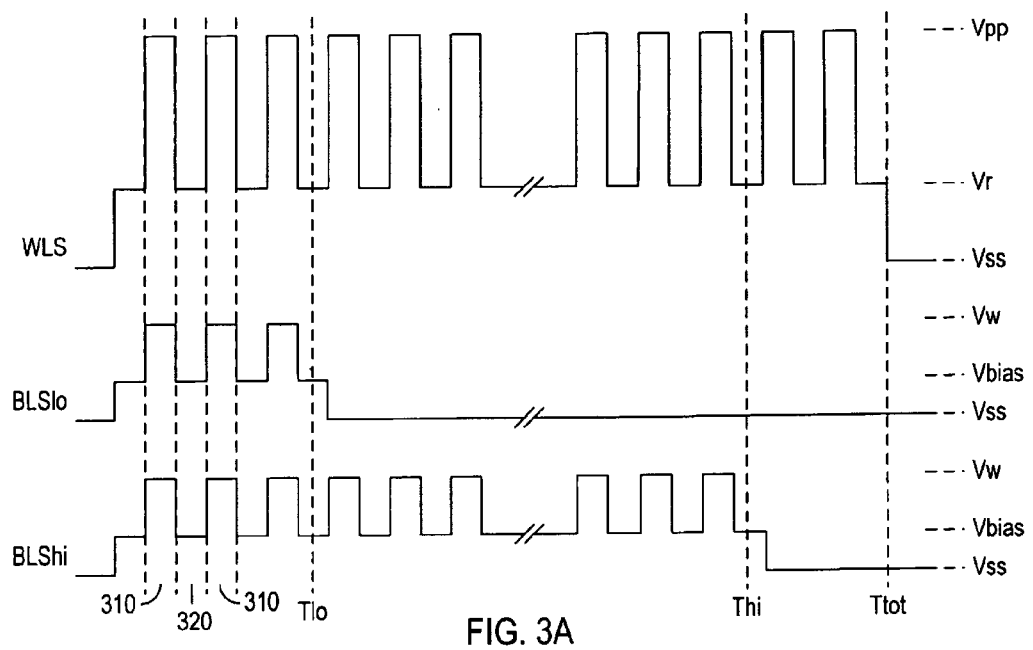
FIG. 3A contains timing diagrams for a conventional write operation with constant gate voltage for a MBPC memory having continuous word lines.

FIG. 3A is a timing diagram for a conventional write operation that can be implemented in MBPC memory 100 of FIG. 1 or MBPC memory 200 of FIG. 2. In FIG. 3A, a signal WLS represents the voltage applied to a word line 114 or 214 that is connected to the control gates or multiple memory cells 112 being programmed simultaneously. Signal BLS1o represents the voltage applied to a column line 116 or 216 of a selected memory cell 112 that is being programmed to a low target threshold voltage, and signal BLShi represents the voltage applied to a column line 116 or 216 of a selected memory cell 112 that is being programmed to a high target threshold voltage.

The write operation of FIG. 3A contains a series of time intervals 310 that are referred to herein as programming cycles 310 and a series of intervals 320 that are referred to herein as verify cycles 320. Each programming cycle 310 for the write operation of FIG. 3A has a fixed duration, which is typically about 1 $\mu$s. During each programming cycle 310, a programming voltage Vpp (typically between 7 and 10 volts relative to a reference voltage Vss) is applied to the word line connected to the memory cells selected for programming. A programming voltage Vw (typically between 4 and 5 volts) is applied to the column lines of the selected memory, and the source lines of the selected memory cells are at a virtual ground voltage close to the reference voltage Vss.

With the high gate voltage Vpp, current through the selected memory cells causes channel hot electron (CHE) injection into the floating gates of the selected memory cells, which increases the threshold voltages of the selected memory cells. FIG. 4 illustrates typical plots 407, 408, 409, and 410 of the threshold voltage Vt versus accumulated programming time for a Flash memory cell with respective applied gate voltage Vg of 7, 8, 9, and 10 volts, at an applied drain voltages Vd of 4.5V and a source voltage Vs of 0V. Plots 407 to 410 illustrate that higher word line voltages cause faster changes in threshold voltage Vt and allow programming of the memory cell to higher threshold voltages. For all gate voltages, the change in threshold voltage Vt per time is fastest when the threshold voltage of the memory cell is lowest. The rate of increase typically saturates after a sufficiently long accumulated programming time (e.g., after about 1 $\mu$s). In this saturation region, changes in threshold voltage Vt have an intrinsic one-to-one correspondence to changes in Vg. This phenomenon can be used to achieve a small change ($\Delta$Vt) in threshold voltage per programming cycle 310 or accurate programming of target threshold voltages.

During verify cycles 320 of FIG. 3A, sensing operations determine whether the selected memory cells have reached their respective target threshold voltages. The length of each verify cycle 320 generally depends on the type of sensing operation used to sense threshold voltage states of the selected memory cells. The sensing operation used in FIG. 3A applies a read voltage $V_R$ (typically about 5 to 7 volts) to the word line connected memory cells selected for programming. A read voltage Vbias (typically about 1 to 1.5 volts) is applied to the column lines of the selected memory cells, and the source lines of the selected memory cells are at the virtual ground voltage near reference voltage Vss. A sense amplifier, which can also be used for read operations, then compares a voltage or current on a selected column line to a reference voltage or current corresponding to the N-bit data value being written in the selected memory cell.

For improved tracking of temperature and endurance effects, the circuit generating the reference signals for verify cycles 320 typically includes one or more reference cells that are identical to the memory cells being programmed and located either inside or outside the main memory array. U.S. patent application Ser. No. 10/173,468, entitled "Bit Line Reference Circuits for Binary and Multiple-Bit-Per-Cell Memories", describes some suitable reference circuits and is hereby incorporated by reference in its entirety.

For each of the selected memory cells, program cycles 310 and verify cycles 320 are repeated until one or more verify cycles 320 indicate that the selected memory cell has reached or exceeded the target threshold voltage corresponding to the multi-bit data value being written in that memory cell. Column line signal BLShi in the write operation of FIG. 3 is for programming one of the selected memory cells to the highest of the target threshold voltages used to represent data. A verify cycle at a time Thi determines that the memory cell has reached the highest target threshold voltage, after which activation of column line signal BLShi for further programming cycles 310 is suppressed.

Time Thi must be less than (or equal to) a total write time Ttot allotted for the write operation. Accordingly, the write operation parameters including write time Ttot, programming voltages Vpp and Vw, the duration of program cycles 310, the duration of verify cycles 320, and the switching or rise and fall times of the word line waveform WLS are such that the write operation can program an operable memory cell to the highest target threshold voltage in less than time Ttot. Using the write operation parameters required for the highest target threshold voltage causes a selected memory cell subject to column line signal BLS1$o$ to reach a low threshold voltage in a much shorter time T1o. At time T1o, the change in threshold voltage per programming cycle 310 is relatively large and can be a significant percentage of the target threshold voltage. Accordingly, the programming cycle that raises the threshold voltage to a level above the lowest target threshold voltage can significantly overshoot the target threshold voltage, which results in poor control or poor resolution of the final threshold voltages of memory cells programmed to lower target threshold voltages.

Figure 3B:
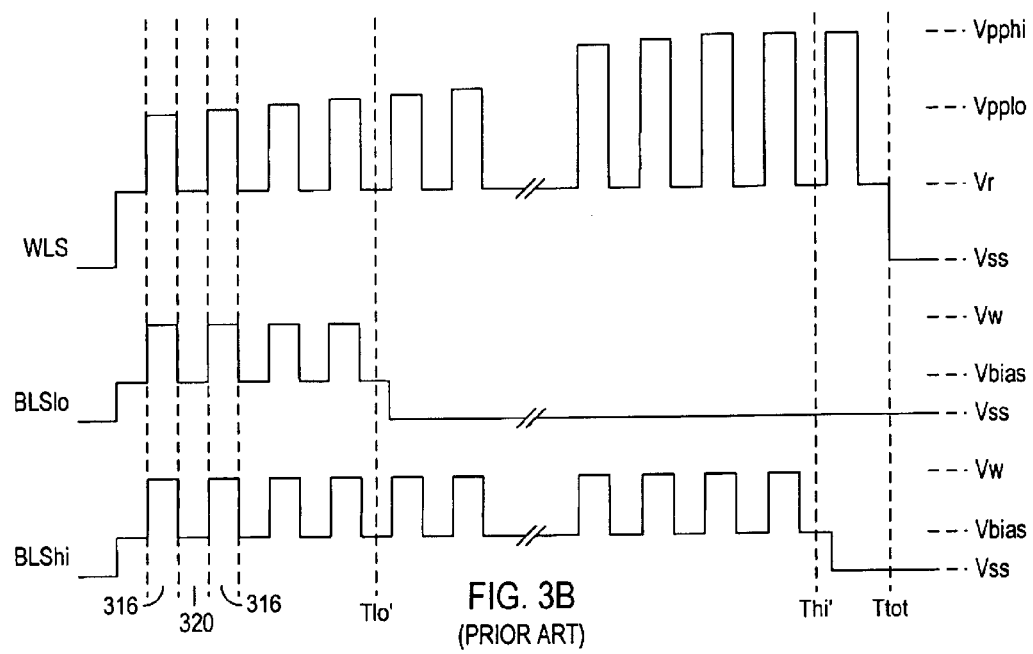
FIG. 3B contains timing diagrams for a conventional write operation with staircase gate voltage waveform with uniform steps for a MBPC memory having continuous word lines.

FIG. 3B shows a timing diagram of another conventional write operation with improved accuracy over those shown in FIG. 3A. The write operation includes programming cycles 316 and verify cycles 320. Verify cycles 320 are the same as the verify cycles described above with reference to FIG. 3A. Programming cycles 316 differ from programming cycles 310 of FIG. 3A in that the programming voltage applied to the selected word line during programming cycles 316 varies. At the start of the write operation of FIG. 3B, programming cycles 316 use a programming voltage Vpp1o on the selected word line, but by the end of the write operation, programming cycles 310 use a higher programming voltage Vpphi on the selected word line. The word line programming voltage varies between voltages Vpp1o and Vpphi for the intervening programming cycles 316.

FIG. 3B illustrates a conventional word line programming voltage waveform, which is a rising staircase in which the rise in the programming voltage from one programming cycle 316 to the next is the same until voltage Vpphi is reached.

When the initial word line programming voltage Vpp1o is substantially lower than voltage Vpp, the programming speed at the start of the write operation of FIG. 3B is generally slower than the programming speed at the start of the write operation of FIG. 3A. Accordingly, any overshoot when a selected memory cell reaches a low target threshold voltage (e.g., at time T1o') is reduced. A further advantage of the lower initial word line programming voltage Vpp1o is the correspondingly lower programming current, which reduces the burden on the high voltage, high current charge pump for the column line drivers.

To complete the write operation of FIG. 3B within the same total available write time Ttot as in the write operation of FIG. 3A, the maximum programming voltage Vpphi in the write operation of FIG. 3B needs to be higher than the programming voltage Vpp, unless other parameters of the programming cycles can be changed. Having a higher maximum programming voltage may be impractical because of its proximity to the drain breakdown voltage of high voltage transistors. A high voltage for Vpphi may also reduce programming accuracy for the higher target threshold voltages. Alternatively, if the maximum programming word line programming voltage Vpphi of FIG. 3B is the same as word line programming voltage Vpp of FIG. 3A, the write operation of FIG. 3B will take longer than the write operation of FIG. 3A. The write operation of FIG. 3B does however improve the programming accuracy of threshold voltages when compared to the write operation of FIG. 3A.

The minimum and maximum word line programming voltages Vpp1o and Vpphi and the change $\Delta$Vpp in word line programming per programming cycle 316 can be chosen to achieve a balance between programming accuracy, write speed, and the capabilities of high voltage charge pumps in the memory. For uniform programming accuracy across the range of target threshold voltages, the programming voltage change $\Delta$Vpp per programming cycle 316 is ideally selected so that each programming cycle 316 causes the same threshold voltage step $\Delta$Vt in a memory cell being programmed. A programming voltage change $\Delta$Vpp per programming cycle 316 can be, for example, about equal to the desired threshold voltage step $\Delta$Vt per programming cycle. However, small uniform threshold voltage steps $\Delta$Vt require more programming cycles 316, and the number of programming cycles 316 needed to reach the maximum word line programming voltage Vpphi determines the write speed. For example, to achieve a threshold voltage resolution smaller than 100 mV, the programming voltage change $\Delta$Vpp will be about 100 mV or less, and more than 30 or more programming cycles 316 (and 30 or more verify cycles 320) would be required to reach maximum programming voltage Vpphi of 10 V if the starting programming voltage Vpp1o is 7 V. If the programming voltage change $\Delta$Vpp were increased to 200 mV, the write operation would require half as many programming and verify cycles, but the threshold voltage resolution would be poorer because of the resulting corresponding increase in the threshold voltage change $\Delta$Vt per programming cycle. The write operation of FIG. 3B with a staircase-increasing word line voltage and uniform duration programming cycles thus requires tradeoffs between write speed and threshold voltage resolution.

Figure 5A:
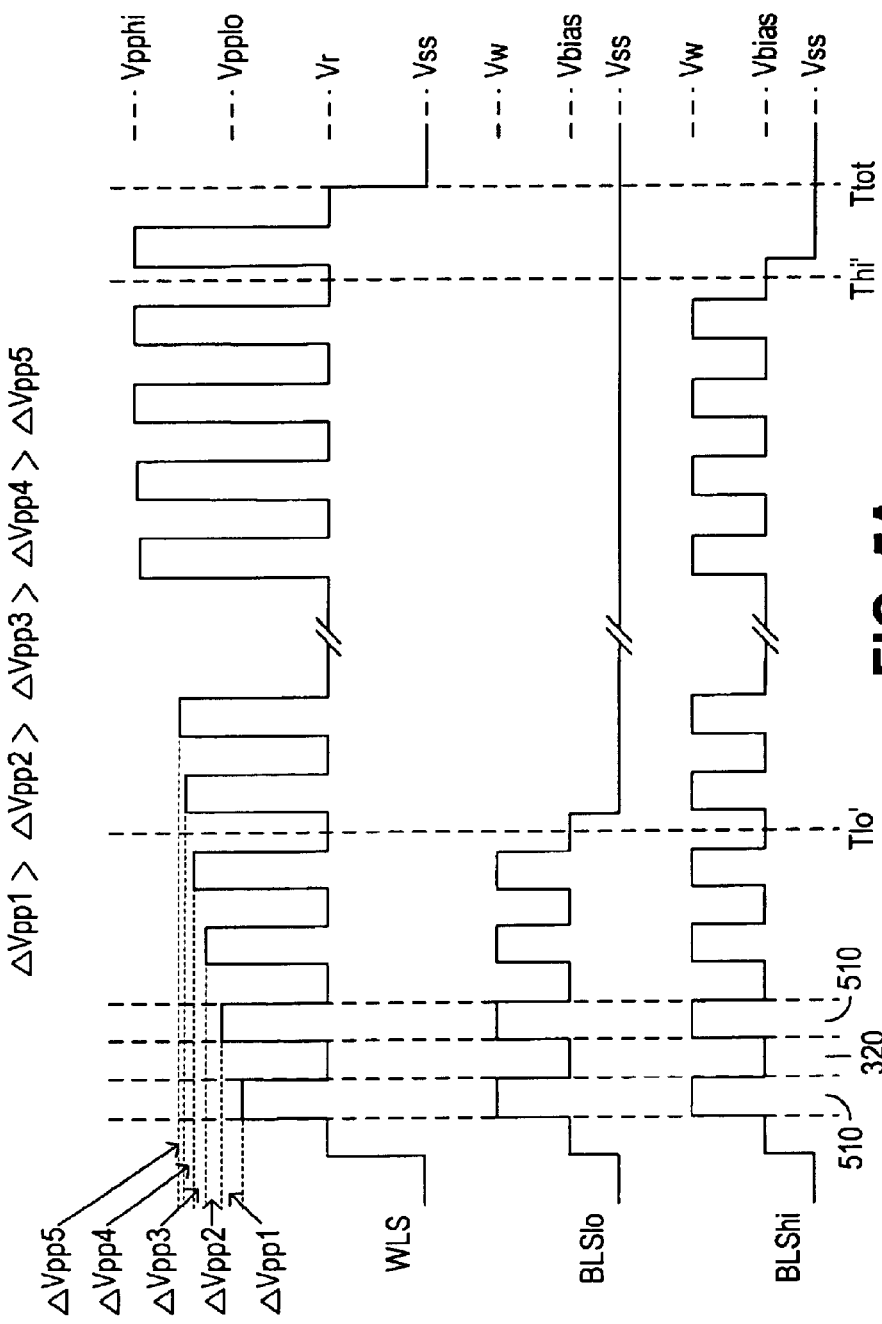
FIG. 5A contains timing diagrams for a write operation with staircase gate voltage waveform with non-uniform steps.

FIG. 5A is a timing diagram for a write operation in accordance with an embodiment of the invention. The write operation of FIG. 5A includes verify cycles 320, which are the same as described above in regard to FIGS. 3A and 3B, and programming cycles 510 during which applied programming voltages increase the threshold voltages of the memory cells being programmed. During programming cycles 510, word line signal WLS is at a programming voltage that increases from one programming cycle 510 to the next. However, unlike conventional write operations that increase the word line programming voltage by the same amount at each step, the write operation of FIG. 5A employs a variable step increase between programming cycles 510. The variability of step size can improve the write speed by reducing the number of programming and verify cycles 510 and 320 needed. Bigger initial steps (e.g., $\Delta Vpp1>\Delta Vpp2>\Delta Vpp3$ . . . ) can increase programming speed with decreasing programming resolution because the target threshold voltage (even the lowest target threshold voltage) would not usually be reached during the early stages of the write operation. The word line programming voltage can increase in a variety of manners. For example, the word line programming voltage can converge to voltage Vpphi in the manner of a parabolic curve, a logarithmic curve, or an RC charging curve.

Figure 5B:
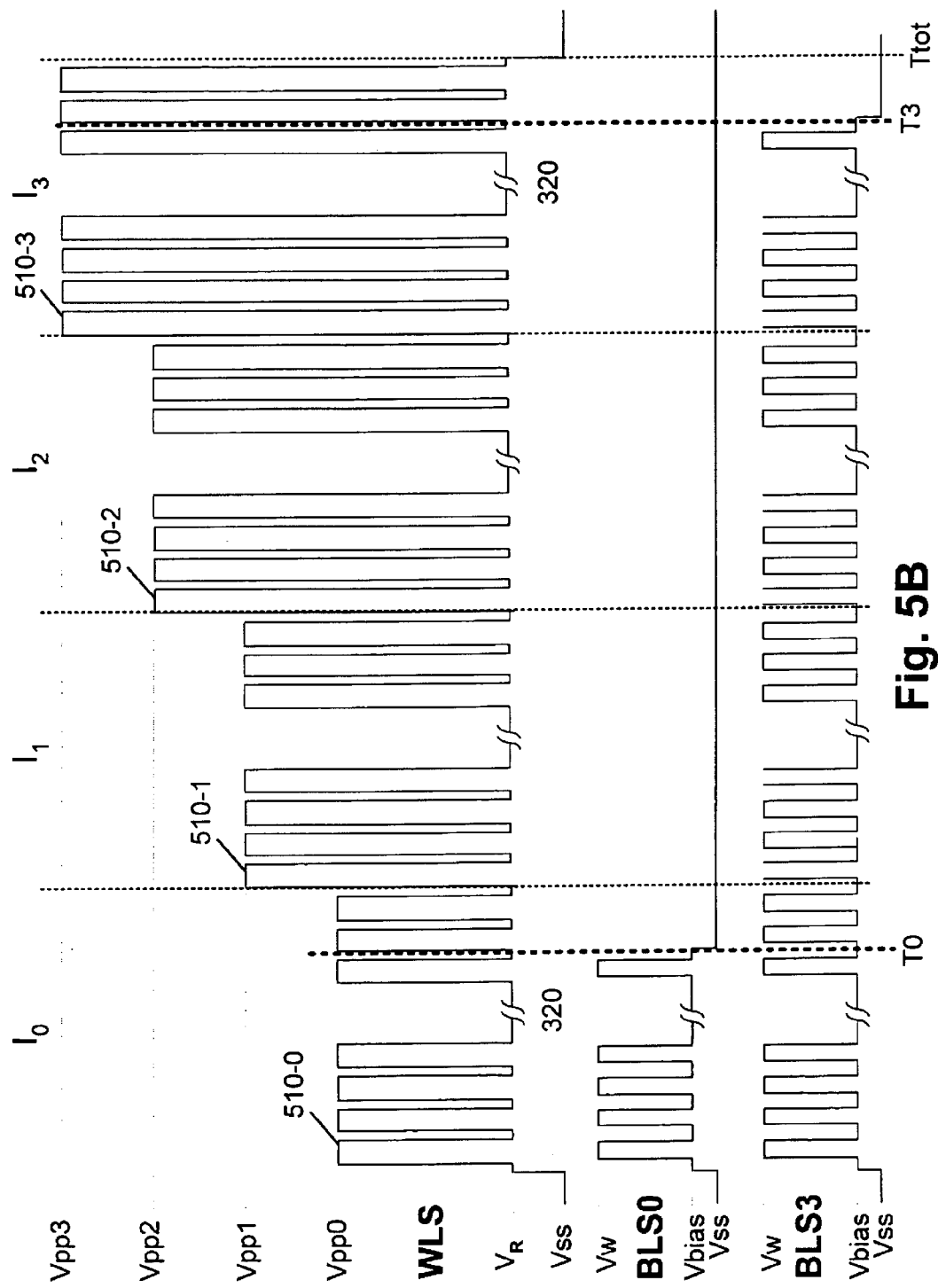
FIGS. 5B, 5C, and 5D contain timing diagrams for alternative embodiments of write operations that program memory cells to different threshold voltage levels at different times.

FIG. 5B illustrates a write operation in accordance with another embodiment of the invention with improved precision. FIG. 5B illustrates a specific example where the number of bits stored per memory cell is two (i.e., N=2) and where the erased threshold voltage is not used as a target threshold voltage for data storage. For the illustrated write operation, the total write time Ttot is divided into four ($2^N$) intervals I0, I1, I2, and I3.

Interval I0 corresponds to the lowest target threshold voltage Vt0 for data storage corresponding to data "11". Target threshold voltage may correspond to a 2-bit value 11$b$, but other mappings between the target threshold voltages and the stored data values can be used. During interval I0, programming cycles 510-0 uses a programming voltage Vpp0 on the selected word line. Programming voltage Vpp0 and the length of interval I0 are preferably selected so that only defective memory cells fail to reach target threshold voltage Vt0 after the accumulated programming time from programming cycles 510-0 during interval I0.

Column line signal BLS0 in FIG. 5B represents the applied column line bias when programming one of the selected memory cells to the lowest target threshold voltage Vt0. A verify cycle 320 at a time T0 determines that the selected memory cell has reached the target threshold voltage Vt0 and in response prevents assertion of the column line voltage required for further programming cycles. Time T0 generally depends on the programming characteristic of the particular cell being programmed and will be shorter or longer depending on whether the selected memory cell programs quickly or slowly.

Intervals I1, I2, and I3 correspond to successively higher target threshold voltages Vt1, Vt2, and Vt3, respectively, and programming cycles 510-1, 510-2, and 510-3 in respective intervals I1, I2, and I3 use successively higher word line programming voltages Vpp1, Vpp2, and Vpp3. Programming voltage Vpp1 and the length of interval I1 are selected so that only defective memory cells fail to reach target threshold voltage Vt1 after the accumulated programming time from programming cycles 510-0 and 510-1 during intervals I0 and I1. Similarly, programming voltage Vpp2 and the length of interval I2 are selected so that only defective memory cells fail to reach target threshold voltage Vt2 after the accumulated programming time from programming cycles 510-0, 510-1, and 510-2 during intervals I0, I1, and I2. Programming voltage Vpp3 and the length of interval I3 are selected so that only defective memory cells fail to reach target threshold voltage Vt3 after the accumulated programming time from programming cycles 510-0, 510-1, 510-2, and 510-3 during intervals I0, I1, I2, and I3.

Column line signal BLS3 in FIG. 5B represents the applied column line bias when programming one of the selected memory cells to the highest target threshold voltage Vt3. A verify cycle 320 at a time T3 determines that the selected memory cell has reached the target threshold voltage Vt3 and in response prevents assertion of the column line voltage required for further programming cycles. The memory cell being programmed to target threshold voltage Vt3 thus completes programming before the end of time interval I3, while the memory cell being programmed to target threshold voltage Vt0 completes programming before the end of time interval I0.

Figure 5C:
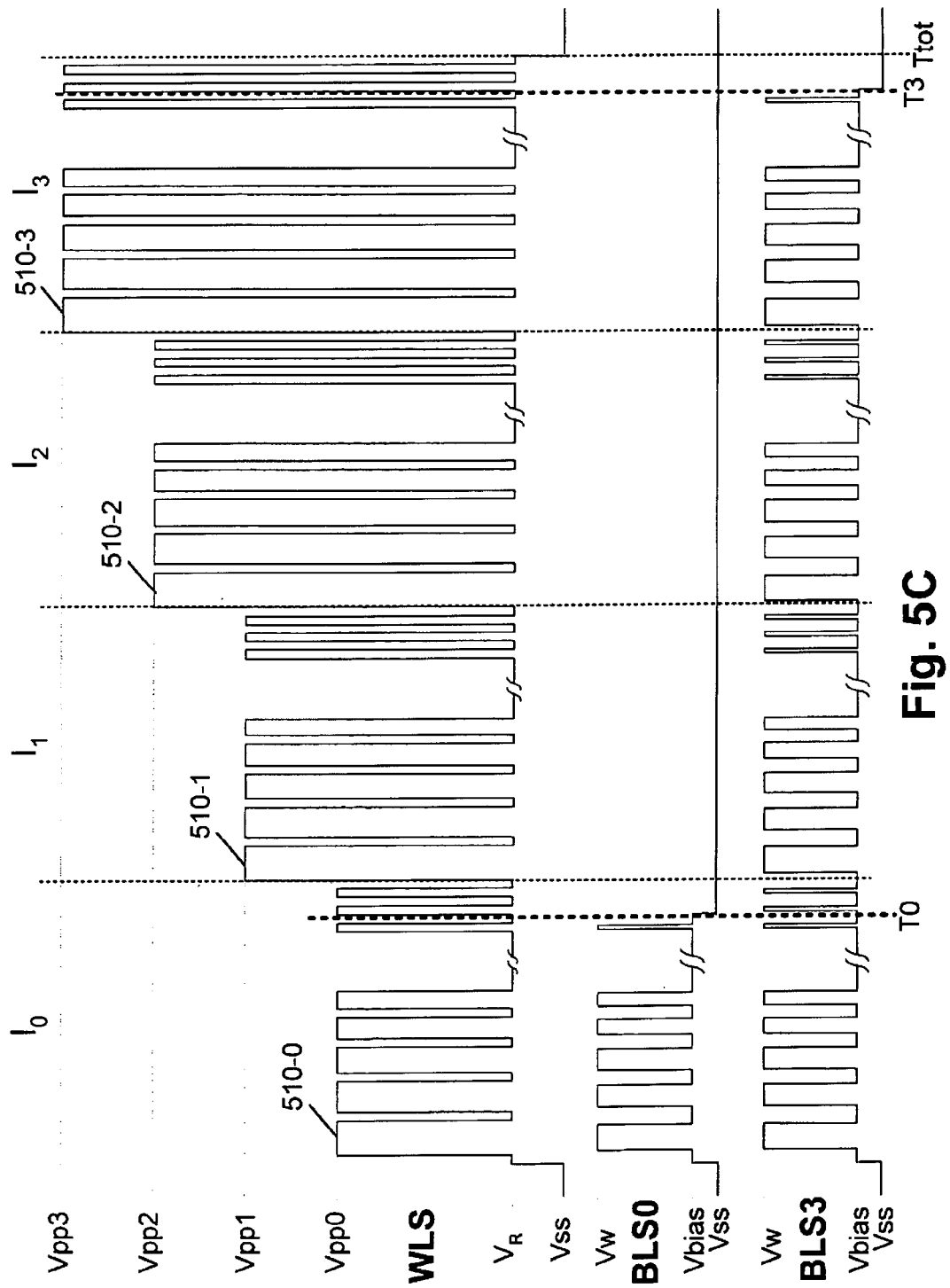

FIG. 5C illustrates timing diagrams for a write operation similar to that of FIG. 5B, but the write operation of FIG. 5C uses programming cycles of varying duration. In particular, to improve the precision of threshold voltage resulting from the write operation of FIG. 5C, the duration of programming cycles 510-0 near the end of interval I0 are shorter than the duration of programming cycles 510-0 at the start of interval I0. The shorter programming cycles cause less threshold voltage change per programming cycle 510-0, so that the results of a verify cycle stops further programming cycles when the memory cell is near to target threshold voltage Vt0. After the end of interval I0, the length of programming cycles 510-1 in the next interval I1 return to the longer duration.

Each of the intervals I0 to I3 has longer programming cycles at the start of the interval when the threshold voltages of memory cells are relatively far from the intended target threshold voltages. The programming cycles are shorter at the ends of intervals I0, I1, I2, and I3 when the selected memory cells are near their intended target threshold voltages corresponding to intervals I0, I1, I2, and I3. Programming accuracy is improved because the change in threshold voltage per programming cycle (or between successive verify cycles) is smaller, resulting in less overshoot of the target threshold voltage and a narrower threshold voltage distribution. Alternatively or additionally, the word line programming voltage can be decreased at the ends of intervals I0, I1, I2, and I3 to decrease the threshold voltage change per programming cycle.

The write operation of FIG. 5C can be further adapted in many ways in keeping with the present invention. For example, in FIG. 5C, intervals I0, I1, I2, and I3 use different word line voltages Vpp0, Vpp1, Vpp2, and Vpp3 for programming cycles 510. With the proper selection of voltages Vpp0, Vpp1, Vpp2, and Vpp3, the intervals I0, I1, I2, and I3 can be made the same length (e.g., Ttot/4) and still ensure that non-defective memory cells reach the target threshold voltages before the ends of the proper time intervals. Alternatively, the same word line voltage Vpp can be used in programming cycles for all of the intervals, but intervals corresponding to lower target threshold voltage could be shorter than intervals corresponding to higher target threshold voltages because of the faster programming rate when the threshold voltage is low. In yet another alternative variation, the word line programming voltage can increase during one or more of intervals I0 to I3 instead of abruptly increasing at the transition from one interval to the next.

The method of varying the duration of programming cycles during each interval is also subject to variation. FIG. 5C illustrates a case where programming cycles continuously decrease in duration until the end of each interval I0, I1, I2, and I3 and then transition back to the longer duration at the start of the next interval. One alternative method uses only two different lengths for the duration of programming cycles. The longer of the two programming cycles is used at the start of each of the intervals I0, I1, I2, and I3 for faster programming, but during each interval, the programming cycles switch to the shorter length when a characterization of the memory cells indicates that fast programming memory cells may be reaching the target threshold voltage corresponding to the interval.

Figure 5D:
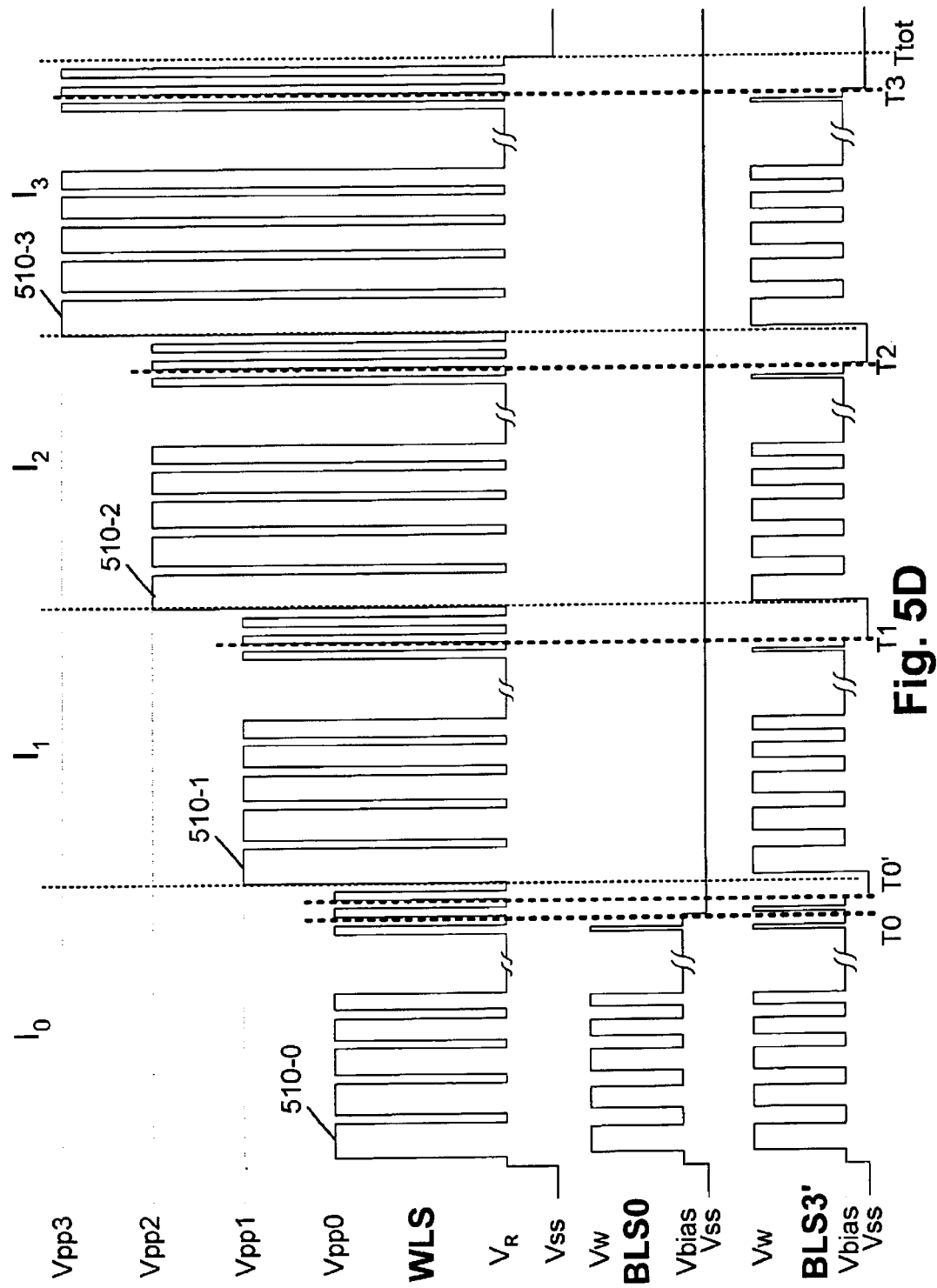

FIG. 5D illustrates a timing diagram for yet another write operation in accordance with an embodiment of the invention. The write method of FIG. 5D is the same as the write method of FIG. 5C except for the operation of the write circuit that controls the column line voltage for writing data values corresponding to target threshold voltages above the lowest target threshold voltage. In particular, the write method of FIG. 5D stops programming cycles at the end of each interval when one or more verify cycles indicate the memory cell has reached the target threshold voltage corresponding to the interval. If the data value being written in a selected memory cell corresponds to a target threshold voltage that is higher than the target threshold voltage for the current interval, programming cycles resume for the memory cell when the next interval starts.

Signal BLS3' in FIG. 5D shows a typical applied column line voltage when programming a selected memory cell to target threshold voltage Vt3. During interval I0, a verify operation at time T0' determines that the selected memory cell has reached threshold voltage Vt0, and further programming cycles during interval I0 then stop. The programming cycles for the selected memory cell being programmed to target threshold voltage Vt0 similarly stop at time T0. Suppressing assertion of column line voltages for the selected column stops the programming cycles 510-0 for the memory cells that have reached target threshold voltage Vt0. The selected word line signal WLS continues to be asserted for other selected memory cells that may not have reached threshold voltage Vt0. FIG. 5D illustrates that differences in the performance of memory cells often cause the memory cells to reach threshold voltage Vt0 at different times (e.g., T0 or T0').

During interval I1, program cycles 510-1 and verify cycles 320 resume for the selected memory cells being programmed to target threshold voltages higher than Vt0, but do not resume for the selected memory cells only being programmed to threshold voltage Vt0. In FIG. 5D, program and verify cycles 510-1 and 320 in column line signal BLS3' commence at the start of interval I1 and end at a time T1 when a verify cycle detects that the threshold voltage of the selected memory cell has reached threshold voltage Vt1. Similarly, in intervals I2 and I3, programming cycles 510-2 and 510-3 resume at the start of the respective intervals and end at times T2 and T3 when verify cycles 320 determine that the selected memory cell has reached respective threshold voltages Vt2 and Vt3.

An advantage of the write operation of FIG. 5D is that the threshold voltages of the selected memory cells at the start of each interval I0, I1, I2, and I3 are better controlled. In contrast, with the programming method of FIG. 5C, the threshold voltages of fast programming memory cells increasingly diverge from the threshold voltage of slow programming memory cells. Accordingly, in the last interval I3 of the programming method of FIG. 5C, the fast programming memory cells may reach the target threshold voltage before programming cycles narrow enough to provide the desired threshold voltage precision.

A write operation that uses programming cycles that all have the shortest length used in the write operations of FIG. 5C or 5D can match the precision of the write operations of FIGS. 5C and 5D. However, using the short programming cycles throughout the write operation requires more verify cycles 320, causing the write operation to take longer.

Figure 6:
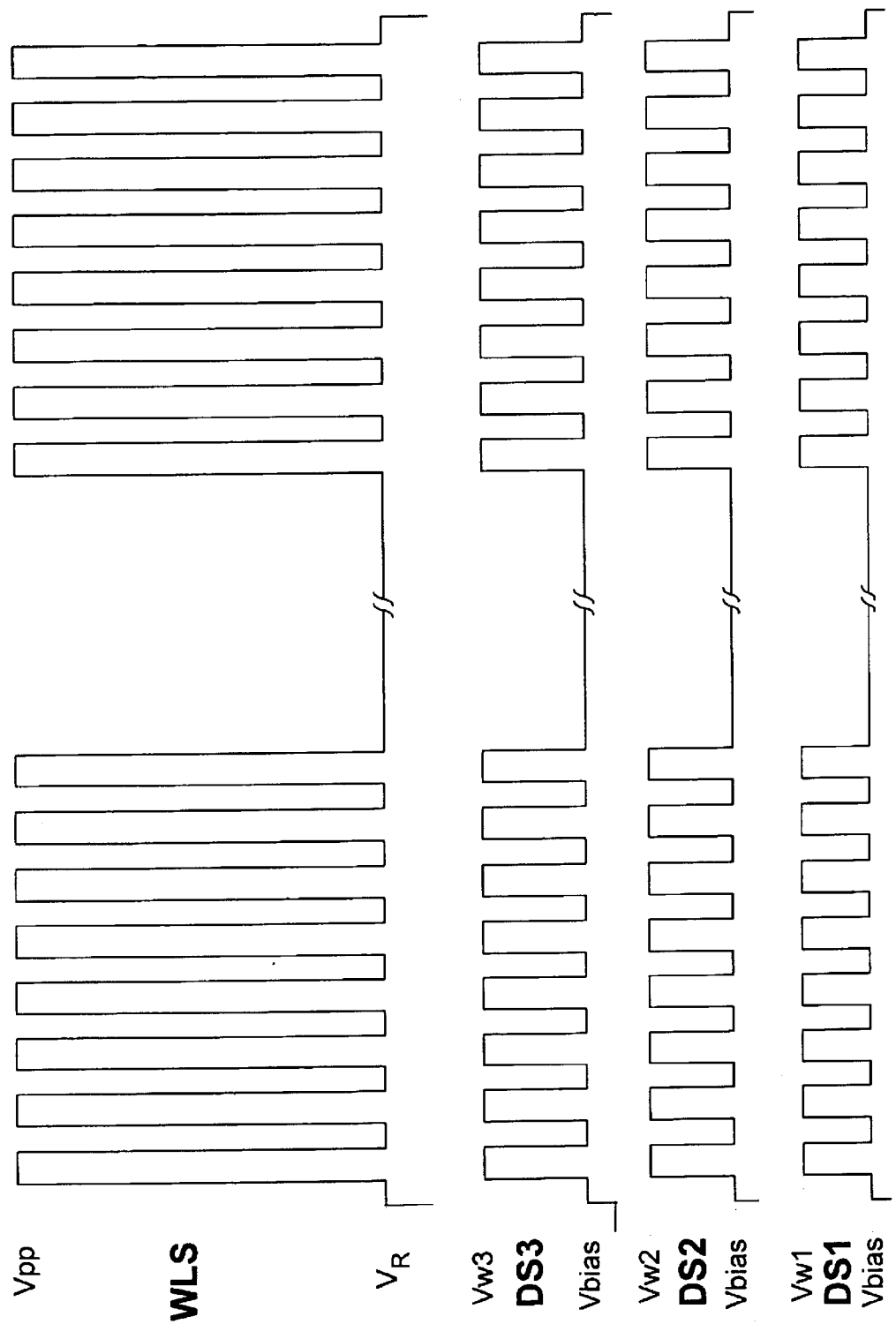
FIG. 6 contains timing diagrams illustrating a write operation using column line biasing that depends on the multi-bit data value being written to a memory cell connected to the column line.

Write operations employing another aspect of the current invention vary the drain and/or source conditions according to the multi-bit data values so that programming memory cells to different target threshold voltages takes about the same amount of time. FIG. 6 shows timing diagrams for a write operation in which each selected column line has a biasing that depends on the multi-bit data value being written in the selected memory connected to that column line. For the write operation illustrated in FIG. 6, a memory stores two bits of data per cell (i.e., N=2) where the erased threshold voltage is one of the target threshold voltages for data storage.

In FIG. 6, signal WLS represents the applied voltage to the selected word line, and signals DS1, DS2, and DS3 represent the applied column line voltages for selected memory cells that are being programmed to target threshold voltages Vt1, Vt2, and Vt3, respectively. During programming cycles 610, signals DS1, DS2, and DS3 rise to respective voltages Vw1, Vw2, and Vw3. The voltages Vw1, Vw2, and Vw3 (and the word line programming voltage Vpp) are preferably selected so that the accumulated programming time of programming cycles 610 will raise the threshold voltage of a non-defective memory cell from the erased threshold voltage to at least the respective target threshold voltages Vt1, Vt2, Vt3.

Figure 7A:
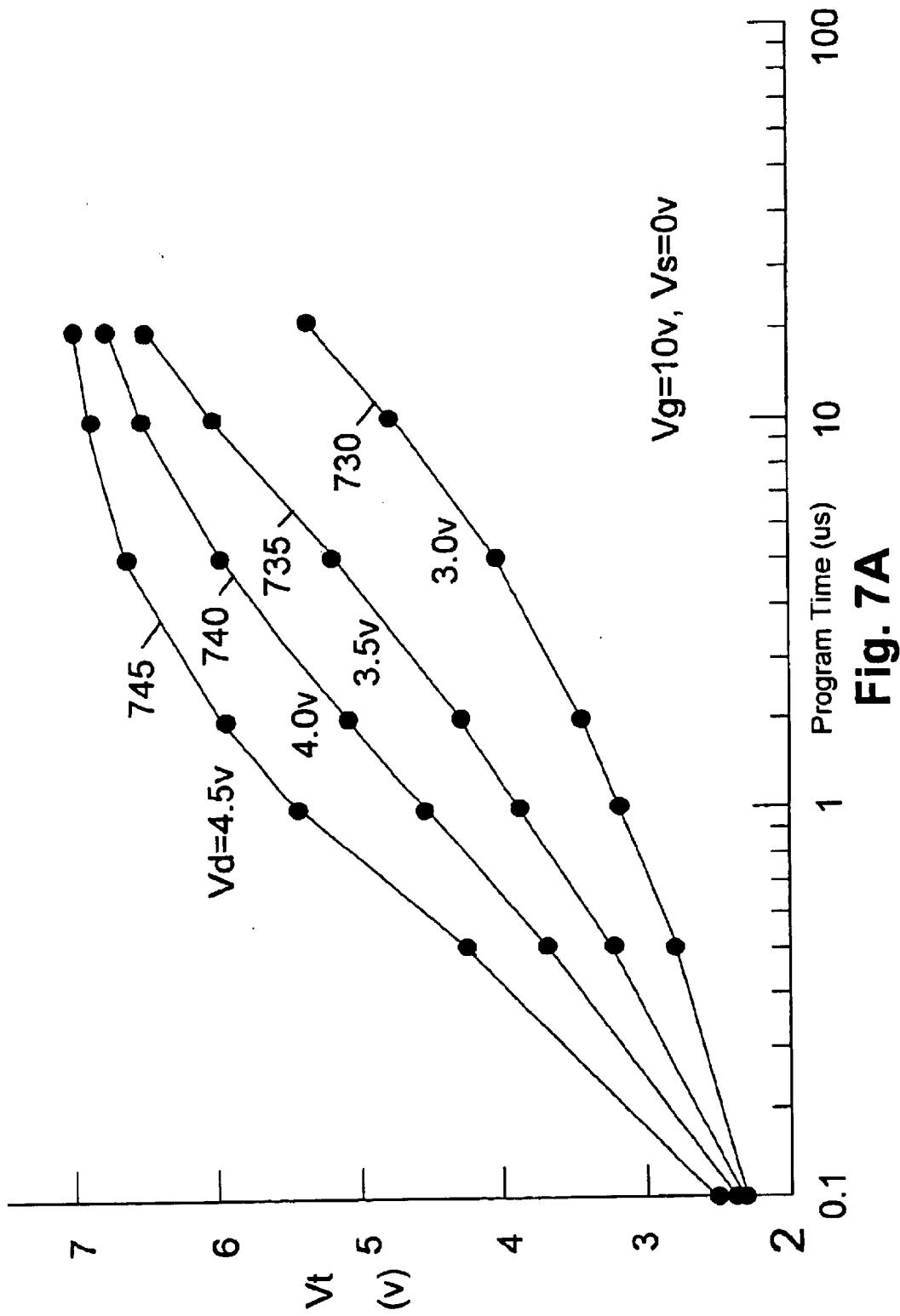
FIGS. 7A and 7B contain plots illustrating the effect of the drain and source voltages on the relation between the threshold voltage and accumulated programming time for a Flash memory cell.

FIG. 7A contains plots 730, 735, 740, and 745 showing the variation of the threshold voltage of a typical Flash memory cell with accumulated programming for applied drain voltages Vd of 3.0, 3.5, 4.0, and 4.5 volts, respectively. A gate voltage Vg of 10 volts and a source voltage Vs of 0 volts apply to each of plots 730, 735, 740, and 745.

Figure 7B:
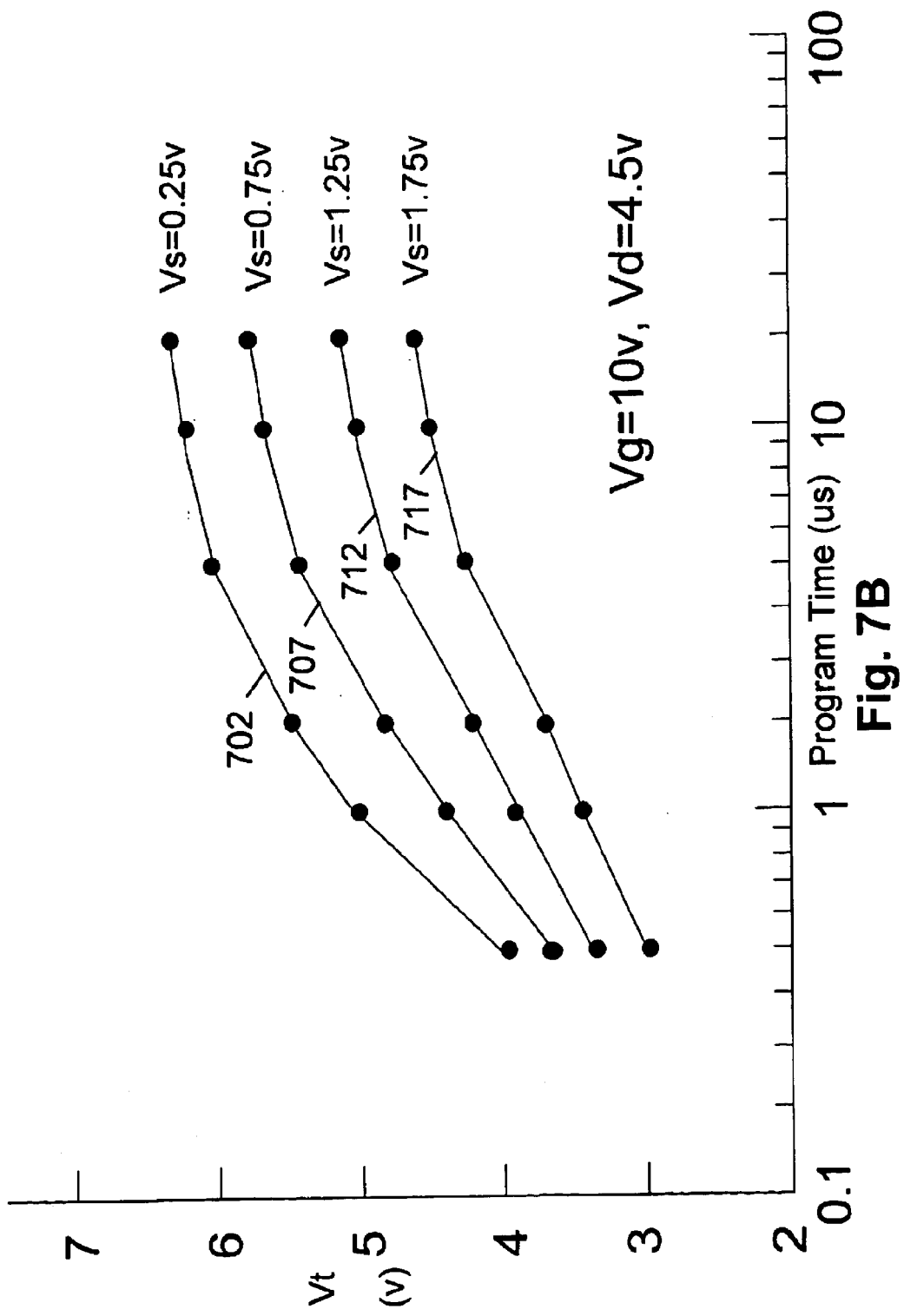

Multi-bit-data-dependent biasing can also be implemented on the source side of selected memory cells if the MBPC memory contains appropriate source line architecture, decoders, and drivers. FIG. 7B contains plots 702, 707, 712, and 717 showing the variation of the threshold voltage of a typical Flash memory cell with accumulated programming for applied source voltages Vs of 0.25, 0.75, 1.25, and 1.75 volts, respectively. A gate voltage Vg of 10 volts and a drain voltage Vs of 4.5 volts apply to each of plots 702, 707, 712, and 717.

In a general case, a MBPC memory can apply multi-bit data-dependent biasing on the drain side of the selected memory cells, on the source side of the selected memory cells, or on both the drain and the source sides of the selected memory cells. FIG. 6 illustrates an example where the data-dependent biasing is on the drain side (i.e., on the column or bit lines), but the drain-side data-dependent bias in the drawings could be used with or replaced by source-side data-dependent biasing. Circuitry for applying multi-bit-data-dependent biasing is described further below.

For the write operation of FIG. 6, the dependence of threshold voltage on the accumulated programming time and the drain voltage (such as characterized in FIG. 7A) and/or source voltage (such as characterized in FIG. 7B) can be used to select multi-bit data-dependent column line voltages Vw1, Vw2, and Vw3 and/or multi-bit data-dependent source voltages that program memory cells to target threshold voltages Vt1, Vt2, and Vt3 within the accumulated programming time of programming cycles 610. The selected memory cells thus reach their respective target voltages near the end of the total write time Ttot. Taking as much of the total write time Ttot as possible improves the accuracy of the write operation because the change in the threshold voltage per programming cycle 610 is reduced.

The write operation of FIG. 6 uses a fixed duration, a constant word line programming voltage Vpp, and constant column line bias Vw1, Vw2, or Vw3 for all programming cycles 710. Varying the duration and/or the programming voltages used in the programming cycles could further improve the precision of the write operation.

Figure 8A:
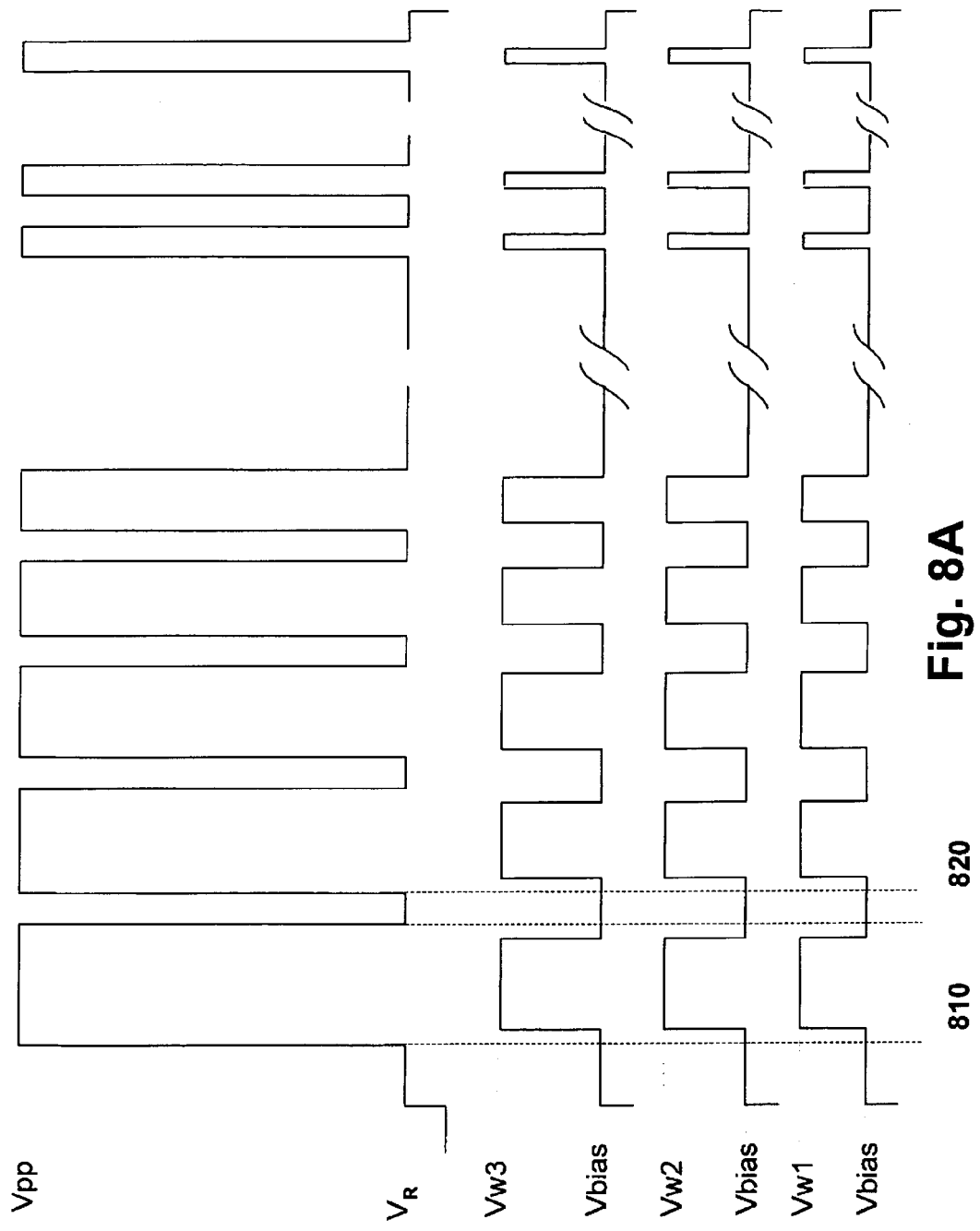

FIG. 8A shows timing diagrams for another write operation having a shared word line signal and column line programming voltages Vw1, Vw2, and Vw3 selected according to the multi-bit data values being written. In the write operation of FIG. 8A, programming cycles 810 vary in duration. In particular, programming cycles 810 are longer at the start of the write operation to reduce the frequency of verify cycles 820 when the memory cells are likely to be far from their respective target threshold voltage. The shorter programming cycles 810 and the more frequent verify cycles 820 at the end of the write operation improve programming accuracy by reducing the threshold voltage change per programming cycle 810 when the memory cells are likely to be reaching their target threshold voltages.

Figure 8B:
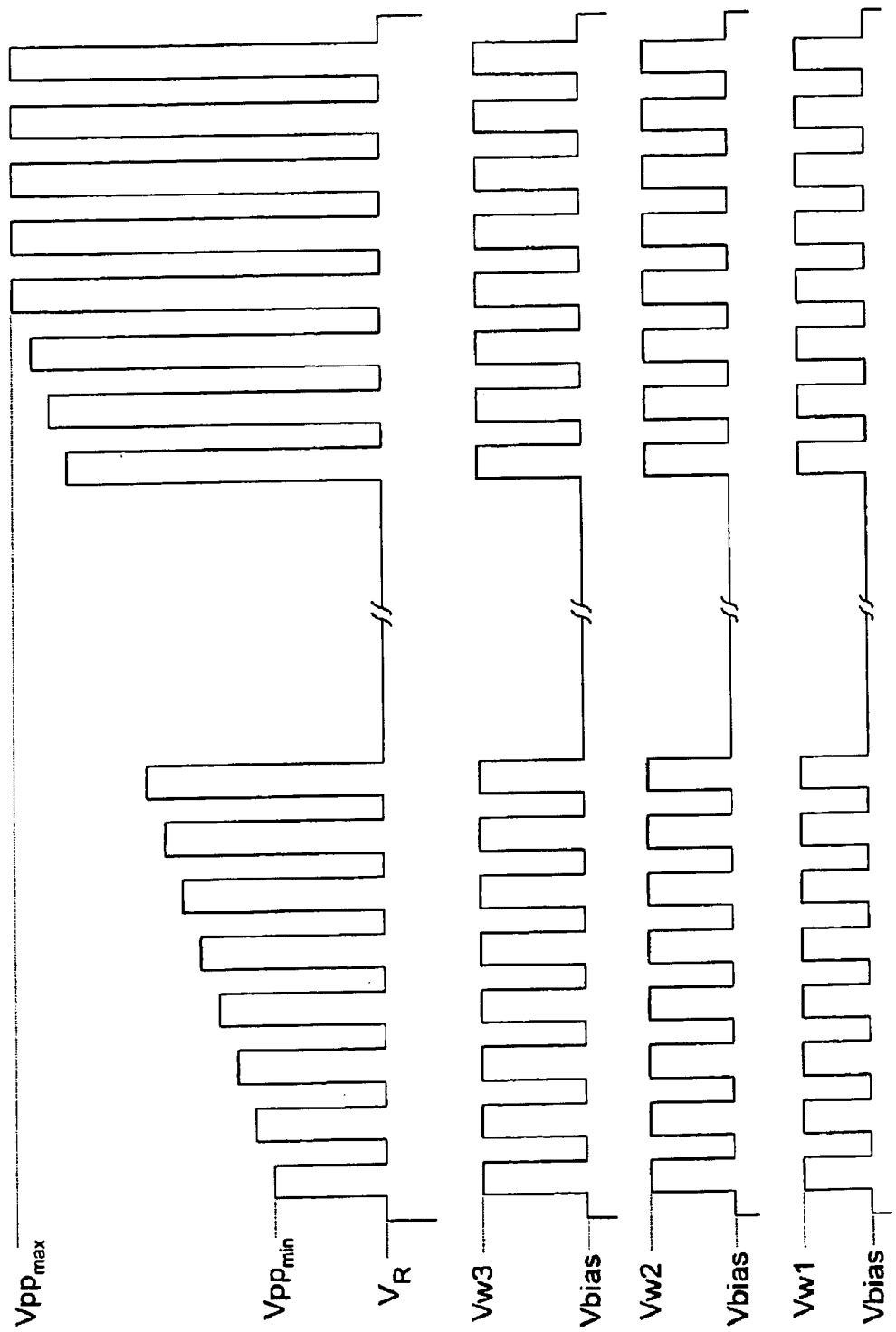

FIG. 8B shows timing diagrams for yet another write operation having a shared word line signal and column line programming voltages Vw1, Vw2, and Vw3 selected according to the multi-bit data values being written. In the write operation of FIG. 8B, a word line programming signal increases in magnitude in a manner similar to the increase in the word line programming voltage of FIG. 3B. Starting the word line programming voltage at a lower level $VPP_{MIN}$ at the start of the write operation reduces the change in threshold voltage per programming cycle 810 at the start of the write operation. Accordingly, fast programming memory cells may be more accurately programmed, especially if the target threshold voltage is low. The write operation of FIG. 8B is thus particularly suited to MBPC memories in which the programming rates of memory cells vary significantly.

Another advantage of the write operation of FIG. 8B (and the write operation of FIGS. 3B and 5A) is that the lower word line programming voltage at the beginning of the write operation reduces the programming current through the memory cells when the threshold voltages of the memory cells are relatively low. The average programming current is expected to be relatively constant because the threshold voltages of the memory cells increase as the word line programming voltage increases. Charge pumps that supply the column line voltages Vw1 to Vw3 thus do not need to be as large as might otherwise be required.

Figure 8C:
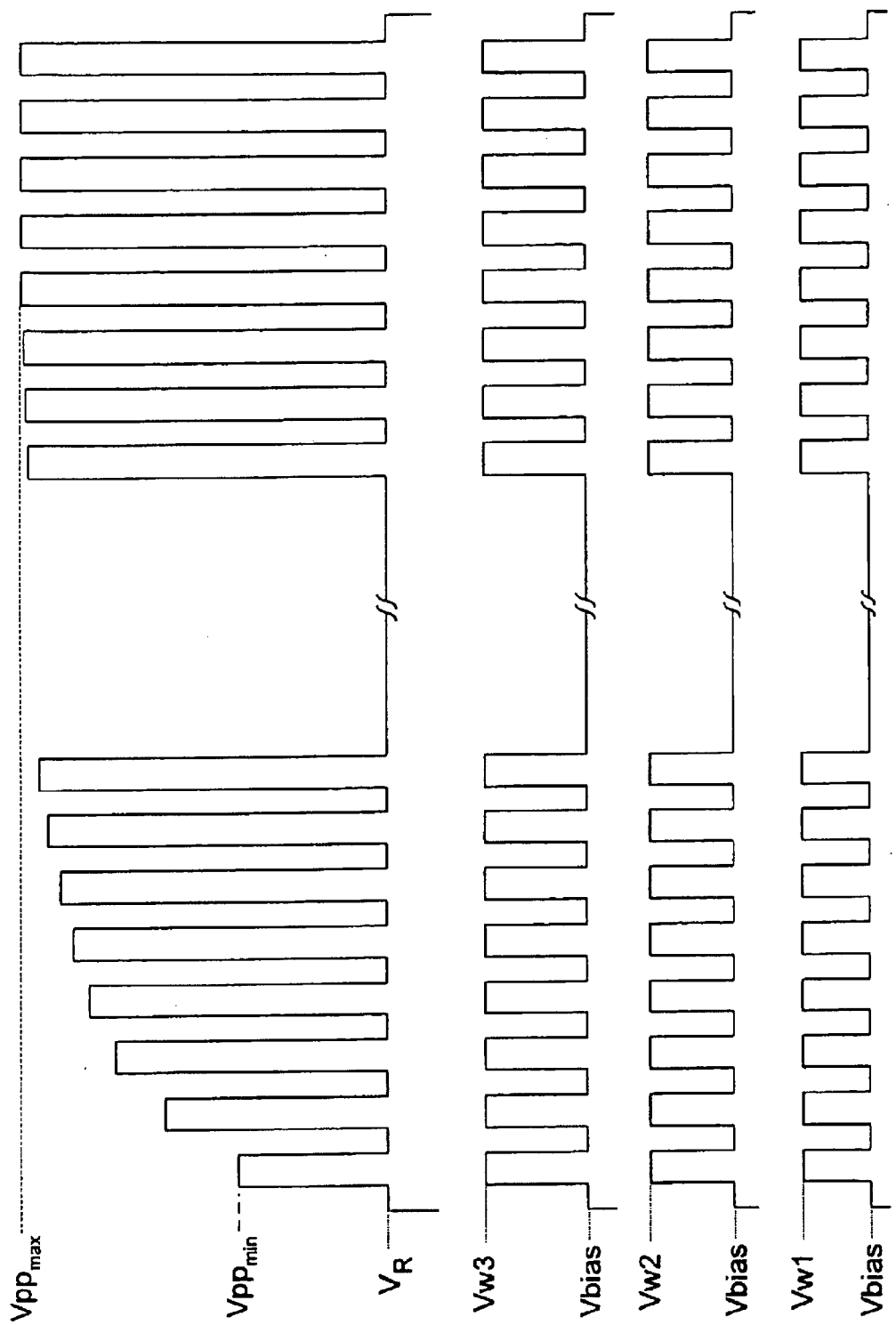
FIGS. 8C and 8E contain timing diagrams for alternative embodiments of write operations using data-dependent column and/or source line programming voltages, and staircase gate voltage waveform with non-uniform steps.

FIG. 8C shows timing diagrams for a write operation that is the same as the write operation of FIG. 8B except that the write operation of FIG. 8C employs a word line waveform having non-uniform increases in the programming voltage.

As noted above, the non-uniform increases can improve programming speeds without sacrificing accuracy and still retain the benefit of a more uniform programming current during the programming cycles.

FIG. 8D shows timing diagrams for yet another write operation in accordance with the invention. The write operation employs both variable word line programming voltages and variable duration for programming cycles 810D. In particular, programming cycles 810D at the start of the write operation use the minimum word line programming voltage Vppmin to limit the programming currents that charge pumps must supply when memory cells have low threshold voltages. Further, to reduce the time spent on verify cycles when the selected memory cells are likely to be far from their respective target threshold voltages, initial programming cycles 810D have the longest duration. The word line programming voltage increases and the duration of programming cycles 810D decrease as the threshold voltages of the memory cells increase and near their respective target threshold voltages until programming cycles 810D reach a minimum duration and/or a maximum word line programming voltage Vppmax. The word line programming voltages used during programming cycle 810D increases in voltage steps that can either be uniform or non-uniform as discussed with reference to FIGS. 3B and 5A.

Figure 8E:
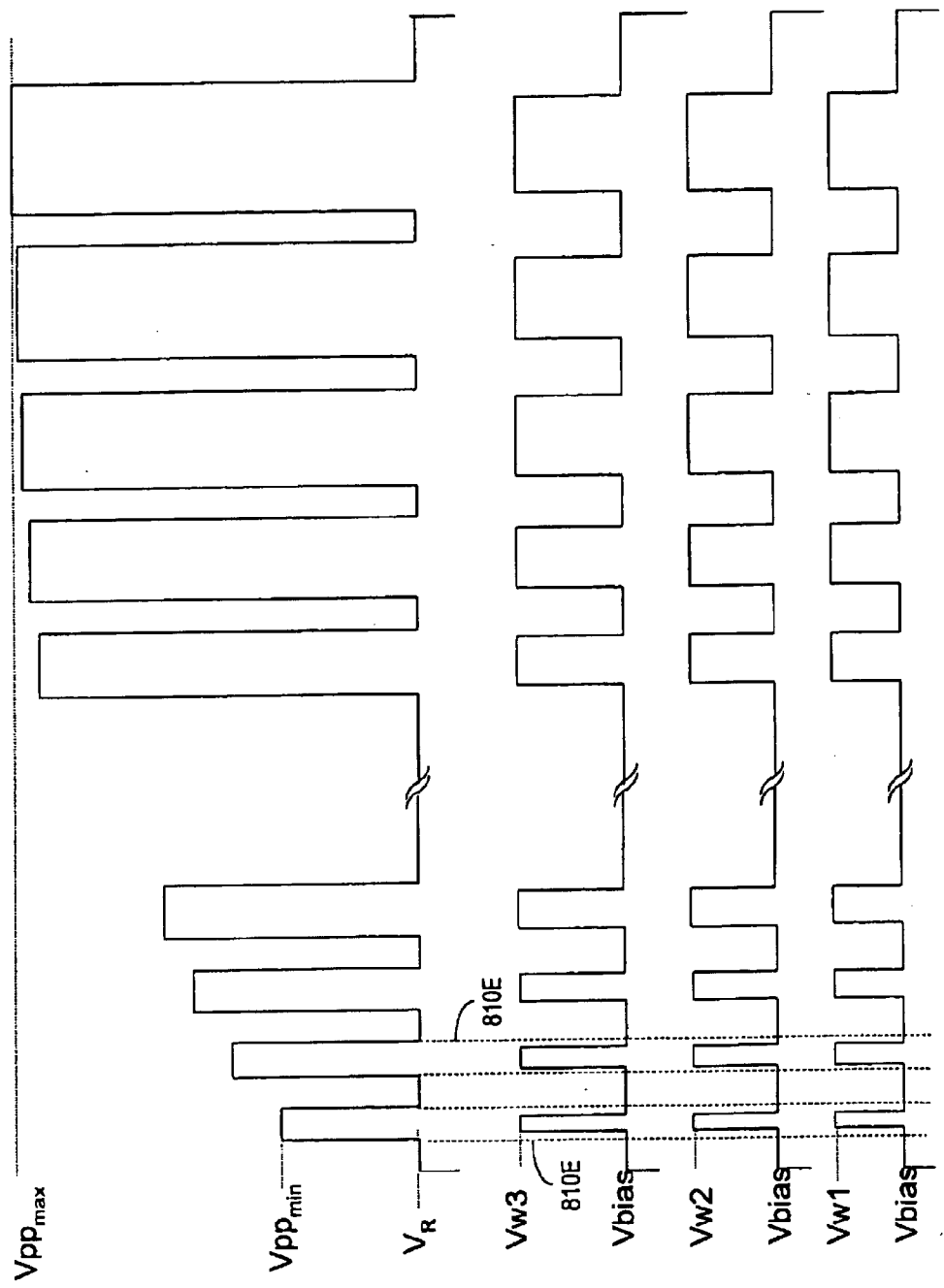

FIG. 8E illustrates another embodiment of a write operation using both variable word line programming voltages and variable programming cycle duration with multi-bit data-dependent bit and/or source line biasing. The write operation of FIG. 8E differs from the write operation of FIG. 8D in that the duration of programming cycles increases throughout the write operation of FIG. 8E. Increasing the duration of the programming cycles 810E can compensate for the smaller rate of threshold voltage change when the threshold voltage of a memory cell is high relative to the available word line programming voltage. FIG. 8E also illustrates a word line programming voltage that increases non-uniformly from one programming cycle 810E to the next.

FIGS. 3, 5A–5D, 6, and 8A–8E illustrate some of the combinations of a shared word line signal that can have fixed or variable programming voltage with fixed or variable length programming cycles and column line or source line biasing that can be fixed or multi-bit data-dependent. Other combinations of these features of the invention can be employed to implement other write operations in accordance with the invention. Table 1 lists some of the write operations in accordance with the invention that are not illustrated in the figures but are related to the illustrated embodiments of the invention.

TABLE 1

Write Operation Combinations

| | | | Programming Cycle | BL Voltage Vw/ SL Voltage Vs | |
|---|---|---|---|---|---|
| | | | Duration PW | Fixed | Variable |
| Shared Word Line Signal (WLS) | Fixed Word Line Programming Voltage Vpp | | Fixed PW | FIG. 3A | FIG. 6 |
| | | | Variable PW | (Not shown) | FIG. 8A |
| | Variable Word Line Programming Voltage Vpp | Incrementally Varied Vpp | Fixed PW | FIG. 5B | (Not shown) |
| | | | Variable PW | FIGS. 5C–5D | (Not shown) |
| | | Staircase Vpp | Uniform Steps | Fixed PW | FIG. 3B | FIG. 8B |
| | | | Variable PW | (Not shown) | FIG. 8D |
| | | | Non- | Fixed PW | FIG. 5A | FIG. 8C |

TABLE 1-continued

Write Operation Combinations

| | | Programming Cycle | BL Voltage Vw/ SL Voltage Vs | |
|---|---|---|---|---|
| | | Duration PW | Fixed | Variable |
| | Uniform Steps | Variable PW | (Not shown) | FIG. 8E |

Figure 9A:
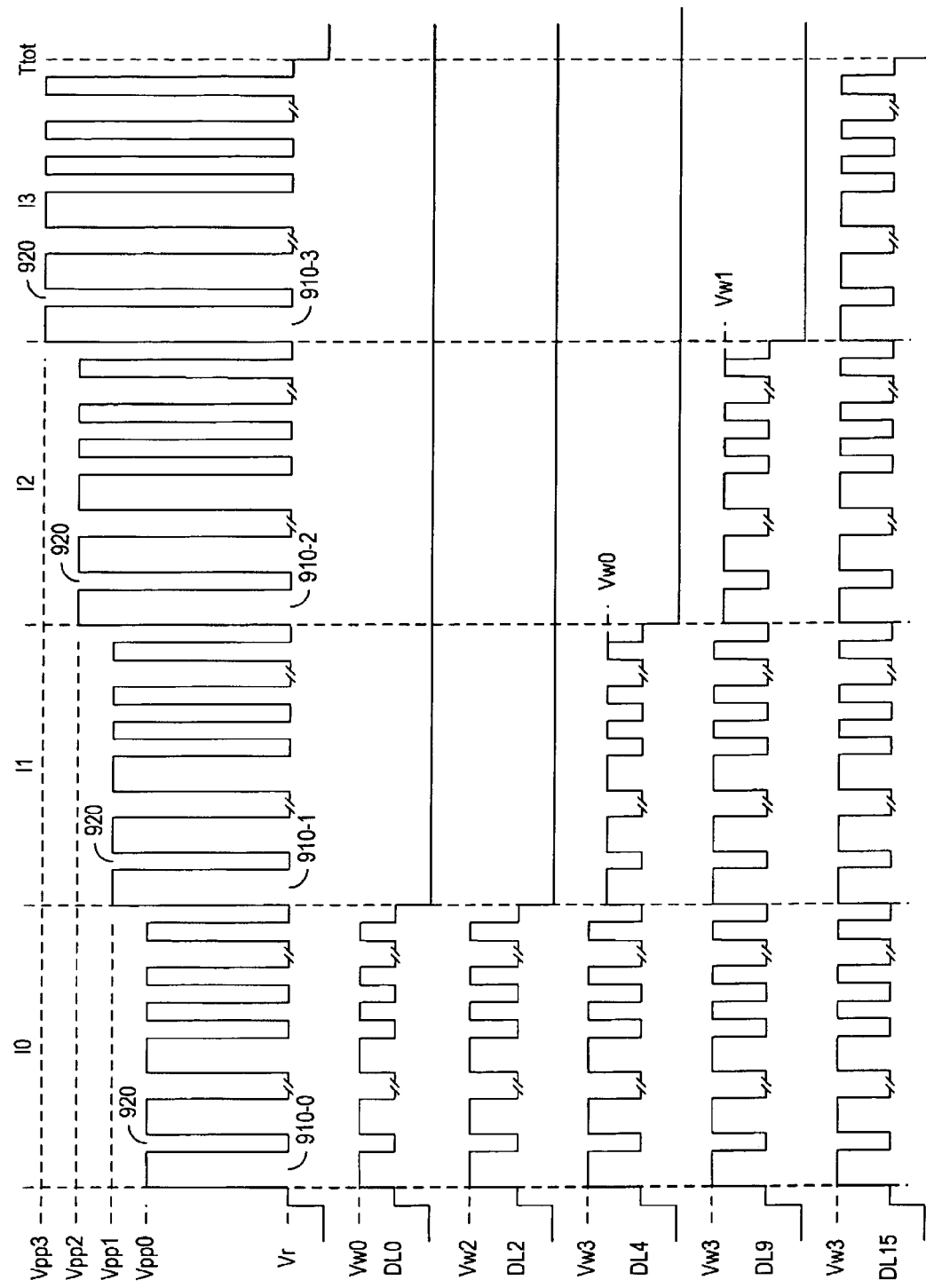
FIGS. 9A and 9B contain timing diagrams for alternative write operation using data-dependent column and/or source line voltages to program memory cells to different threshold voltage levels at different times.

The principles of the two types of write operation described above can be combined so that, a write operation using multi-bit-data-dependent bit and/or source line biasing still reaches different threshold voltages at different times. FIG. 9A shows a timing diagram for a 4-bit (or 16 levels) per cell memory having a total available write time of Ttot divided into four intervals I0, I1, I2, I3. The shared world line signal is asserted to voltage Vpp0, Vpp1, Vpp2, and Vpp3 for programming cycles 910-0, 910-1, 910-2, and 910-3 during intervals I0, I1, I2, and I3, respectively. The selected word line has read voltage $V_R$ for verify cycles 920.

The write operation of FIG. 9A has column and/or source line biases selected according to the multi-bit data values being written. In FIG. 9A, word line programming voltage Vpp0 when combined with the multi-bit data-dependent column line voltages Vw0, Vw1, Vw2, and Vw3 program the selected memory cells to the respective target threshold voltages Vt0, Vt1, Vt2, and Vt3 within time interval I0. The write operation then suppresses programming cycles for selected memory cells into which data corresponding to target threshold voltages Vt0, Vt1, Vt2, and Vt3 are being stored. Column line signals DL0 and DL2 for memory cells being programmed to target threshold voltages Vt0 and Vt2 are illustrated as examples in FIG. 9A. Selected memory cells being programmed to target threshold voltages higher than threshold voltage Vt3 are programmed up to threshold voltage Vt3 during interval I0, and programming cycles in following intervals I1, I2, and I3 raise those memory cells to their respective target threshold voltages.

Time intervals I1, I2, and I3 respectively correspond to target threshold voltage states Vt4 to Vt7, Vt8 to Vt11, and Vt12 to Vt15. During programming cycles 910-1, 910-2, and 910-3 of respective intervals I1, I2, and I3, the shared word line signal has a voltage Vpp1, Vpp2, or Vpp3 and the multi-bit data-dependent column/source line voltages are selected to program selected memory cells from the target threshold voltage reached during the last interval (i.e., Vt3, Vt7, or Vt11) to one of the four target voltages corresponding to the interval. For interval I1 or I2, selected memory cells being programmed to target threshold voltages higher than the highest target threshold voltage corresponding to the interval (i.e., higher than Vt7 or Vt11) are programmed up to their target voltage in a subsequent interval I2 or I3. Once a memory cell reaches its target threshold voltage for data storage, the write operation suppresses further programming cycles by deasserting the column line voltage required for the programming cycles.

FIG. 9A shows exemplary column line signals DL4, DL9, and DL15 for respective memory cells being programmed to a target threshold voltage Vt4, Vt9, and Vt15, respectively. Signal DL4 uses column line voltage Vw3 for programming cycles 910-0 that raise a selected memory cell to threshold voltage Vt3 during time interval I0 and uses column line voltage Vw0 for programming cycles 910-1 that raise the threshold voltage of the selected memory cell from target threshold voltage Vt3 to Vt4. Signal DL9 uses column line voltage Vw3 during programming cycles 910-0 and 910-1 that raise the threshold voltage of a selected memory cell to threshold voltage Vt7 and uses column line voltage Vw1 during programming cycles 910-2 that raise the threshold voltage of the selected memory cell from threshold voltage Vt7 to target threshold voltage Vt9. Signal DL15 uses column line voltage Vw3 during programming cycles 910-0, 910-1, 910-2, and 910-3 to raise the threshold voltage of the selected memory cell to the highest target threshold voltage Vt15.

In each of the intervals, I0, I1, I2, and I3 of FIG. 9A, the duration of respective programming cycles 910-0, 910-1, 910-2, and 910-3 are longer at the beginning of the interval and shorter at the end of the interval. The decrease in duration can be done as illustrated in FIG. 9A in a single step from longer duration programming cycles when memory cells are expected to be far from their target threshold voltages to shorter duration programming cycles when memory cells may be nearing their target threshold voltages. Alternatively, the duration of programming cycles can continuously decrease in duration during each interval I0, I1, I2, and I3 or the fixed duration could be used throughout.

The write operation of FIG. 9A can employ a smaller number of multi-bit data-dependent column and/or source line biases to program memory cells to a larger number of target threshold voltages. The write operation of FIG. 9A also does not require dividing the total write Ttot into a larger number of intervals (e.g., 16 intervals for a 4-bit-per-cell memory), where the intervals may be too short to allow accurate programming.

Figure 9B:
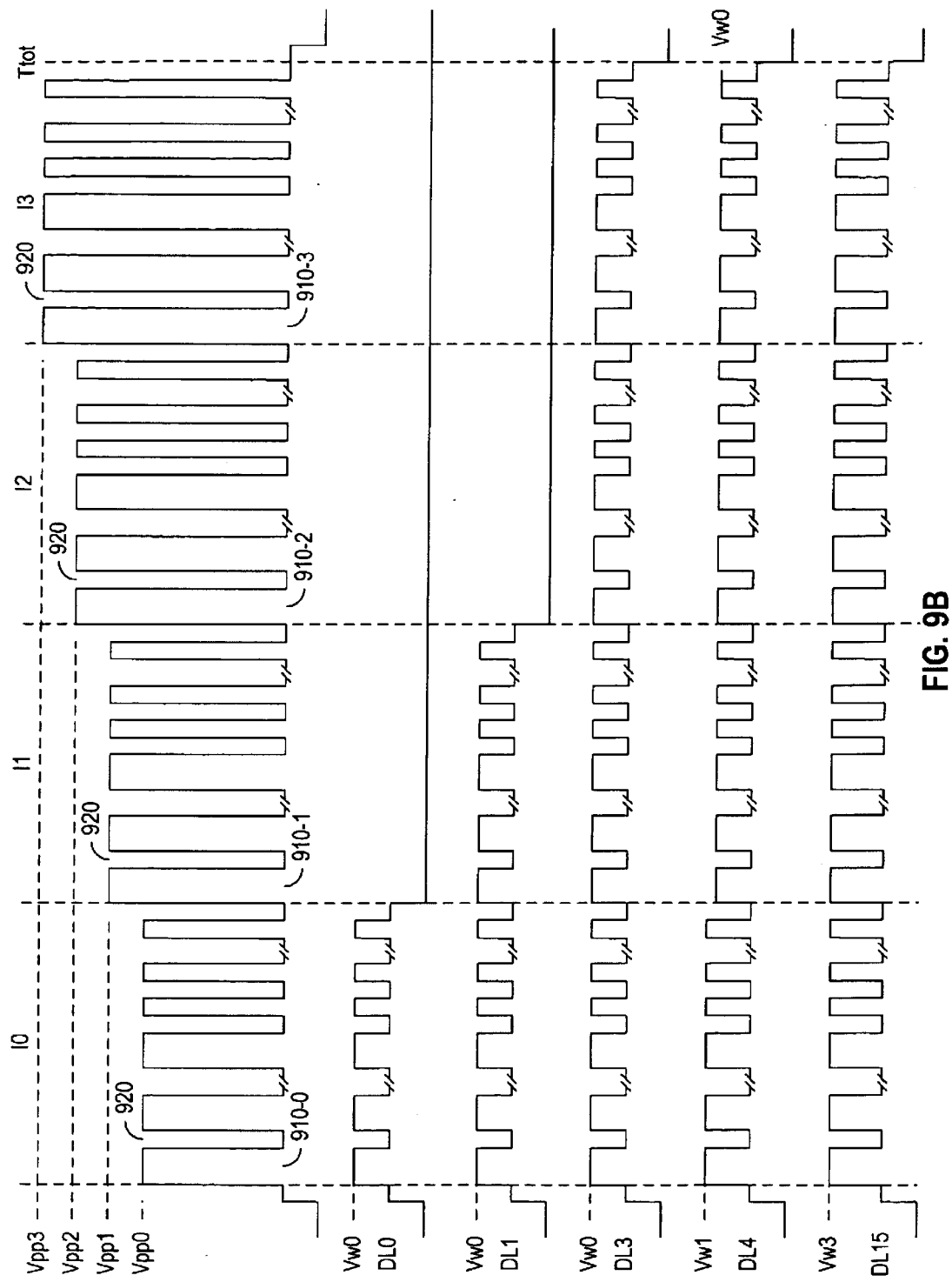

FIG. 9B shows a timing diagram for yet another write operation for a 4-BPC memory having a shared word line signal and data-dependent column and/or source line biasing. For the write operation of FIG. 9B only the lowest target threshold voltages (e.g., Vt0 to Vt2) are reached in significantly less than the full programming time Ttot. For the lowest target threshold voltages, a low column line voltage Vw0 and/or high source line bias during the programming cycles causes selected memory cells to reach target threshold voltages Vt0, Vt1, Vt2, and Vt3 before the ends of intervals I0, I1, I2, and I3, respectively. For higher target threshold voltages V4 to V15, the column line voltage can be raised and/or the source line bias can be lowered to increase the programming rate for at least a portion of total programming time Ttot. For example, to reach target threshold voltage Vt4, programming cycles in interval I0 can use a higher column line voltage Vw1 to increase the programming rate, and programming cycles in intervals I1, I2, and I3 can use a lower column line voltage Vw0 for higher threshold voltage resolution when the memory cell reaches the target threshold voltage Vt4. In effect, the threshold voltage of the selected memory rises two target levels (to Vt2) in interval I0 and one level in each of intervals I1, I2, and I3 so that selected memory cells reach the target threshold voltage Vt4 before the end of the total write time Ttot.

A common difficulty for write operations in MBPC memories is the difference in the programming rates for memory cells. If a memory cell programs too quickly or too slowly, programming parameters such as the word, column, and source line voltages that are chosen for a memory cell having typical programming characteristics may overshoot or never reach the desired target threshold voltages. If testing can identify such memory cells, the memory cells can be designated defective, requiring either that the memory be either repaired with redundant elements or discarded. However, testing may be unable to detect memory cells having programming characteristics that will change with use such as endurance cycling or data retention.

Fast programming cells are less of a problem since such cells reach their target threshold voltages during the available program time, and the use of lower word line programming voltages for initial programming cycles limits the maximum threshold voltage change per programming cycle. The write operations described above can thus achieve a reasonable accuracy even for fast programming memory cells.

Figure 10:
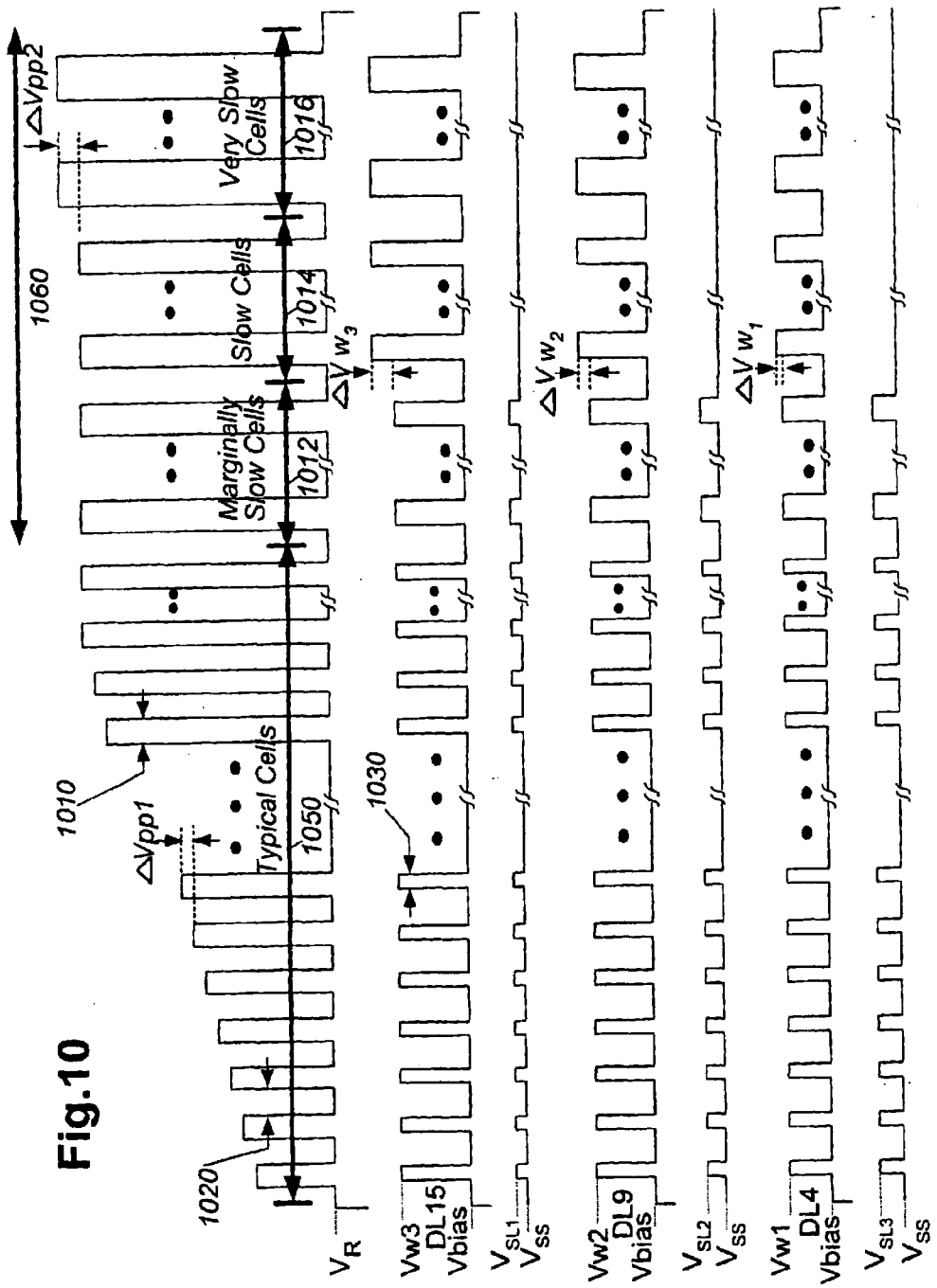
FIG. 10 illustrates timing diagrams for a write operation including remedial programming cycles for slow programming memory cells.

Slow memory cells that fail to reach the target voltage within the available programming time are sure to cause a data error, which must be avoided. In accordance with an aspect of the invention, time can be budgeted for remedial programming cycles for memory cells that program slowly. FIG. 10 illustrates timing diagrams for a write operation including remedial programming cycles for slow programming memory cells. A first portion 1050 of the write operation is for typical memory cells, and a second portion 1060 of the write operation includes the remedial programming cycles for the memory cells that program slowly.

Write operation portion 1050 in FIG. 10 uses a word line signal WLS having a staircase-increasing word line programming voltage that is applied during a series of programming cycles 1010 having uniform duration as in the write operation of FIG. 8B. Other types of write operations such as the write operations of FIGS. 3A, 3B, 5A, 6, 8A, 8B, 8C, 8D or 8E could similarly use remedial programming cycles, which are added at the ends of the write operations to avoid errors resulting from slow programming memory cells. Further, remedial programming 1040 can be applied at the end of any or all of the intervals at which memory cells are expected to reach particular target threshold voltages. Remedial programming sequences could for example be added at the ends of intervals I0, I1, I2, and I3 of the write operations such as the write operations illustrated in FIGS. 5B, 5C, 5D, 9A, and 9B.

An exemplary embodiment of the write operation of FIG. 10 is for a 4-BPC memory and allocates about 17 µs to write operation portion 1050. Each programming cycle 1010 is about 200 ns long with an effective program or drain pulse width 1030 of about 100 ns. Each verify cycle 1020 is between consecutive programming cycles 1010 and is about 300 ns long. As a result, when the erased threshold voltage corresponds to one of the sixteen 4-bit data values, the write operation portion 1050 uses up to 34 programming cycles 1010 for programming of typical memory cells to any of the fifteen different target threshold voltage levels. The word line programming voltage during programming cycles 1010 starts at about 6.0 volts and rises to about 9.0 volts. The change $\Delta V_{pp1}$ in the programming voltage from one programming cycle to the next is 100 mV or larger so that there are 29 or less programming cycles with word line programming voltages less than 9.0 volts and 5 or less programming cycles using a word line programming voltage of 9.0 V.

Column line bias voltages Vw1, Vw2, and Vw3 and the source line bias voltages VSL1, VSL2, and VSL3 are selected and used in combinations such that typical memory cells are programmed to respective target threshold voltages Vt1 to Vt15 before the end of write operation portion 1050.

At the end of write operation portion 1050, any memory cells that have not reached their respective target threshold voltage are considered slow-programming cells. Remedial programming 1060 applies programming cycles to the slow-programming cells to raise their threshold voltages to the respective target threshold voltages. To complete the programming within the available write time, programming parameters during remedial programming can be changed to increase programming rates for the slow programming cells.

In the embodiment of FIG. 10, remedial programming 1060 includes a first set of programming cycles 1012 that have an increased duration (e.g., programming cycles of 300 ns instead of 200 ns) to increase the threshold voltage change per cycle. Increasing the duration of the programming cycles generally provides a disproportionately greater increase in the effective programming time since rise and fall times are about constant. An increase of programming cycle time from 200 ns to 300 ns may, for example, increase the effective drain pulse time from 100 ns to 200 ns. For a "marginally slow" memory cell, one of the verify cycles 1020 between programming cycles 1012 will indicate that the memory cell has reached its target voltage.

If none of the verify cycles 1020 following remedial programming cycles 1012 indicate the memory cell has reached its target threshold voltage, remedial programming cycles 1014 having higher column line bias and no source line bias are applied to the slow programming memory cells, while programming cycle duration is the same as in 1012. Higher column bias can be achieved by increasing the output voltage of a charge pump that is controlled by a voltage regulator. (See FIG. 13.) If after remedial programming cycles 1014 a very slow memory cell still fails to reach its target threshold voltage, remedial programming cycles 1016 having further increased program cycle duration (e.g., 500 ns or more) are applied to the memory cell while the programming voltage on the shared word line voltage is also increased to the maximum allowable voltage, which is typically limited by the breakdown voltage of the high-voltage transistors. The increase in the duration or programming voltages for the remedial programming cycles generally do not cause a problematic overshoot of the target threshold voltages because only memory cells that have proven to program very slowly are subject to the remedial programming 1060. The typical or fast programming memory cells will have reached their respective target threshold voltages during write operation portion 1050 so that column line voltages and source line biasing are not asserted for any of the remedial programming cycles. Further, the slow programming memory cells that are subject to the remedial programming cycles 1060 are typically being programmed to the highest target threshold voltage for which overshooting of the target is more tolerable.

Figure 11:
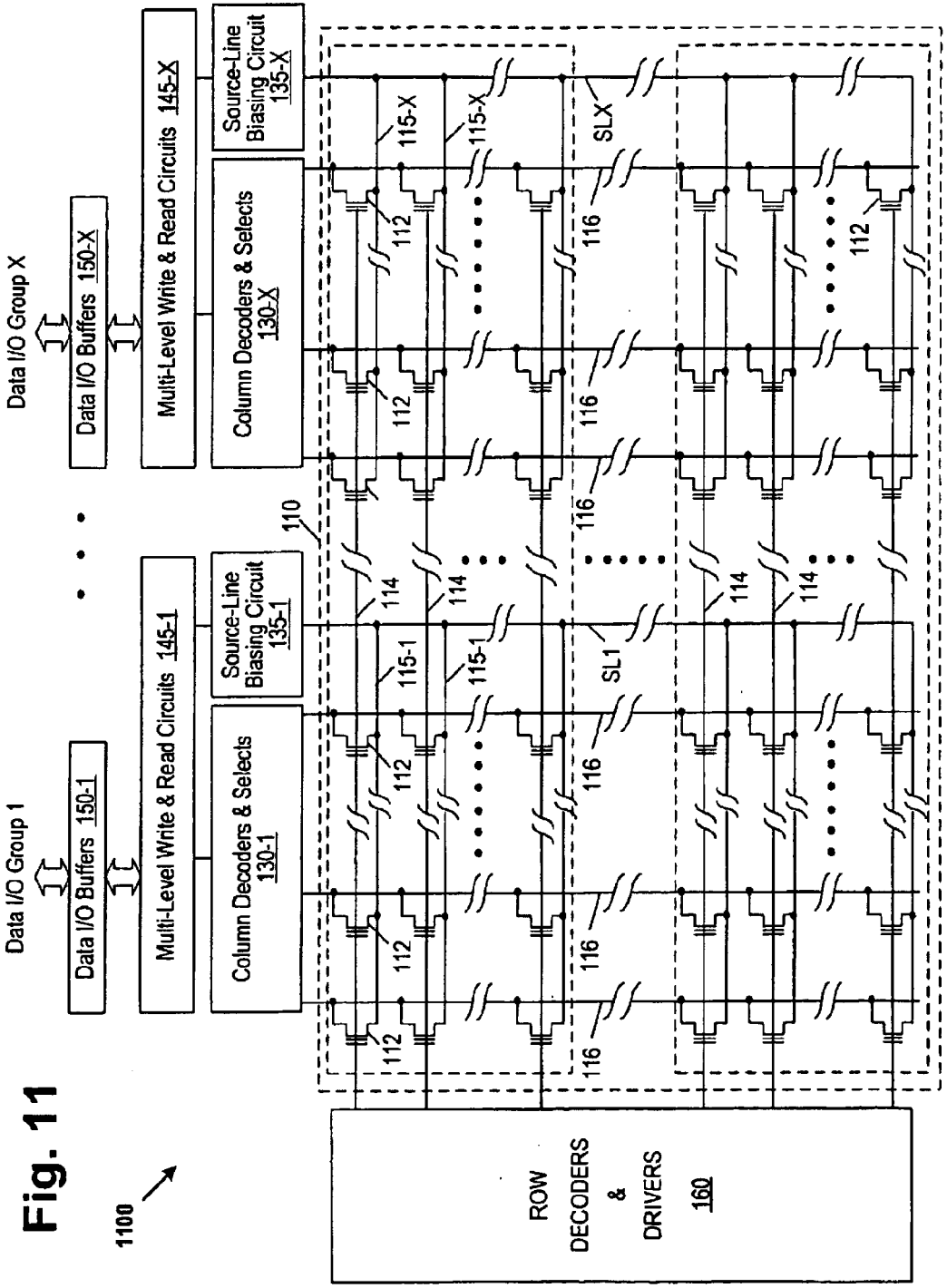
FIG. 11 shows a MBPC Flash memory having a divided source line that permits data-dependent source line biasing during a write operation.

FIG. 11 shows an embodiment of a Flash memory 1100 employing multi-bit data-dependent source line biasing. Flash memory 1100 is similar to Flash memory 100 of FIG. 1 and contains circuit elements having same structure and functions as similarly numbered elements described above with reference to FIG. 1. However, memory 1100 differs from memory 100 in that source line groups 115-1 to 115-X are connected to respective source line biasing circuit 135-1 to 135-X, which are under the control of respective multi-level write circuits 145-1 to 145-X. Each of write circuits 145-1 to 145-X control the writing of a multi-bit data value to one of the memory cells 112 connected to the corresponding one of the source line groups 145-1 to 145-X. Multilevel write circuits 145-1 to 145-X cause respective source line bias circuits 135-1 to 135-X to bias respective source lines 115-1 to 115-X to the voltage levels corresponding to the multi-bit data values being simultaneously written.

Figure 12A:
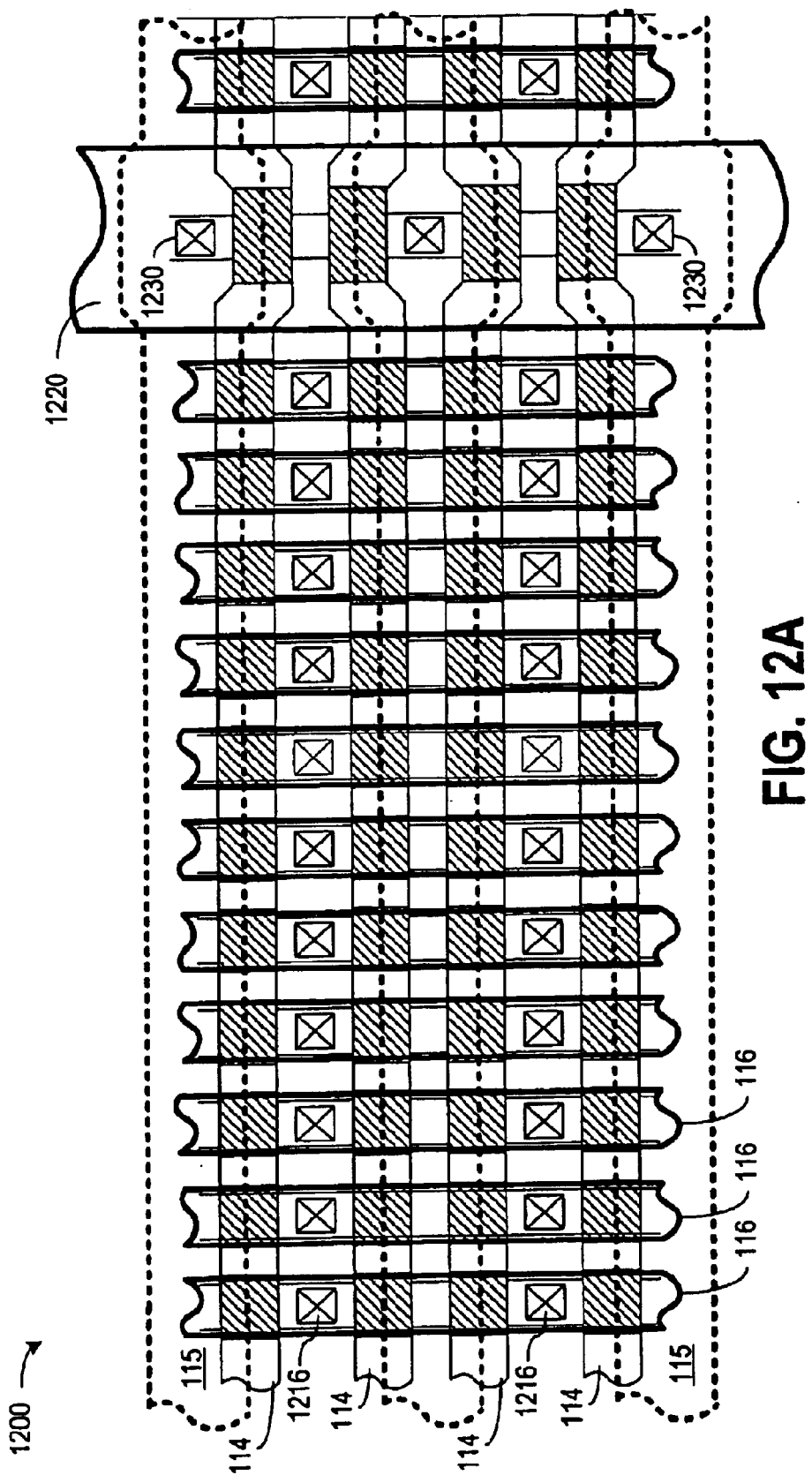
FIG. 12A shows a layout for continuous source lines for a conventional Flash memory.
Figure 12B:
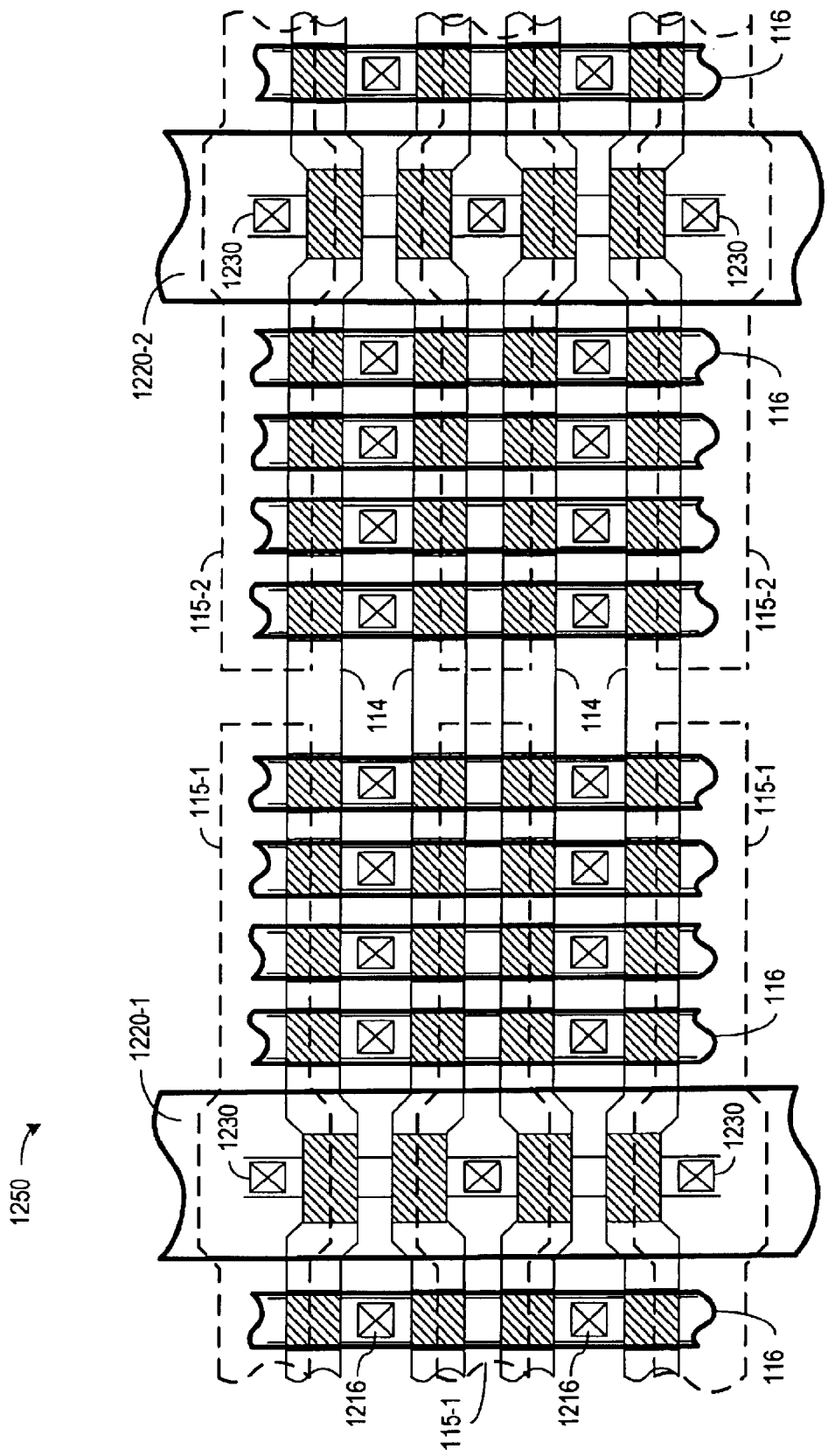
FIG. 12B shows a layout for divided source lines for a Flash memory in accordance with an embodiment of the invention using data-dependent source biasing.

Multi-bit data-dependent source line biasing as in Flash memory 1100 requires source lines that are divided according to the sets of memory cells that can be simultaneously accessed, unlike conventional source line configurations that have common continuous source lines. FIGS. 12A and 12B show layouts for diffused source lines respectively for a common continuous source line structure and a divided source line structure.

FIG. 12A shows a layout 1200 for a continuous source line architecture that is suitable for a conventional Flash memory array. Diffused source lines 115 in a semiconductor substrate form the sources of the memory cells, and bit lines 116 contact diffused drain regions in the substrate via contacts 1216. Word lines 114 overlie floating gates and channel regions that are between respective source and drain regions. Diffused source lines 115 connect to metal source lines 1220 via contacts 1230. The number and location of metal source lines 1220 generally depends on tolerable diffused source-line resistance between the memory cells and the metal source-line.

FIG. 12B shows a layout 1250 for a divided source line architecture suitable for a Flash memory such as memory 1100 having multi-bit data-dependent source line biasing. Layout 1250 differs from layout 1200 in that diffused source lines 115-1 and 115-2 are electrically isolated from each other. Accordingly, memory cells connected to the same word line 114 can be connected to different source line groups 115-1 and 115-2, which permits independent virtual grounding or source line biasing. Each group of diffused source lines 115-1 or 115-2 connects to at least one corresponding metal source line 1220-1 or 1220-2 via contacts 1230, and metal source lines 1220-1 or 1220-2 for the source line group connect to different source line bias circuits. The number of metal source lines 1220-1 and 1220-2 may be the same as in layout 1200 of FIG. 12A depending on the number of columns of memory cells corresponding to a particular source line group and the tolerable resistance along diffused source lines 115-1 and 115-2. Accordingly, an increase in memory array area required for divided source lines will generally only be due to the separations between diffused source lines 115-1 and 115-2 required to achieve electrical isolation.

Figure 13:
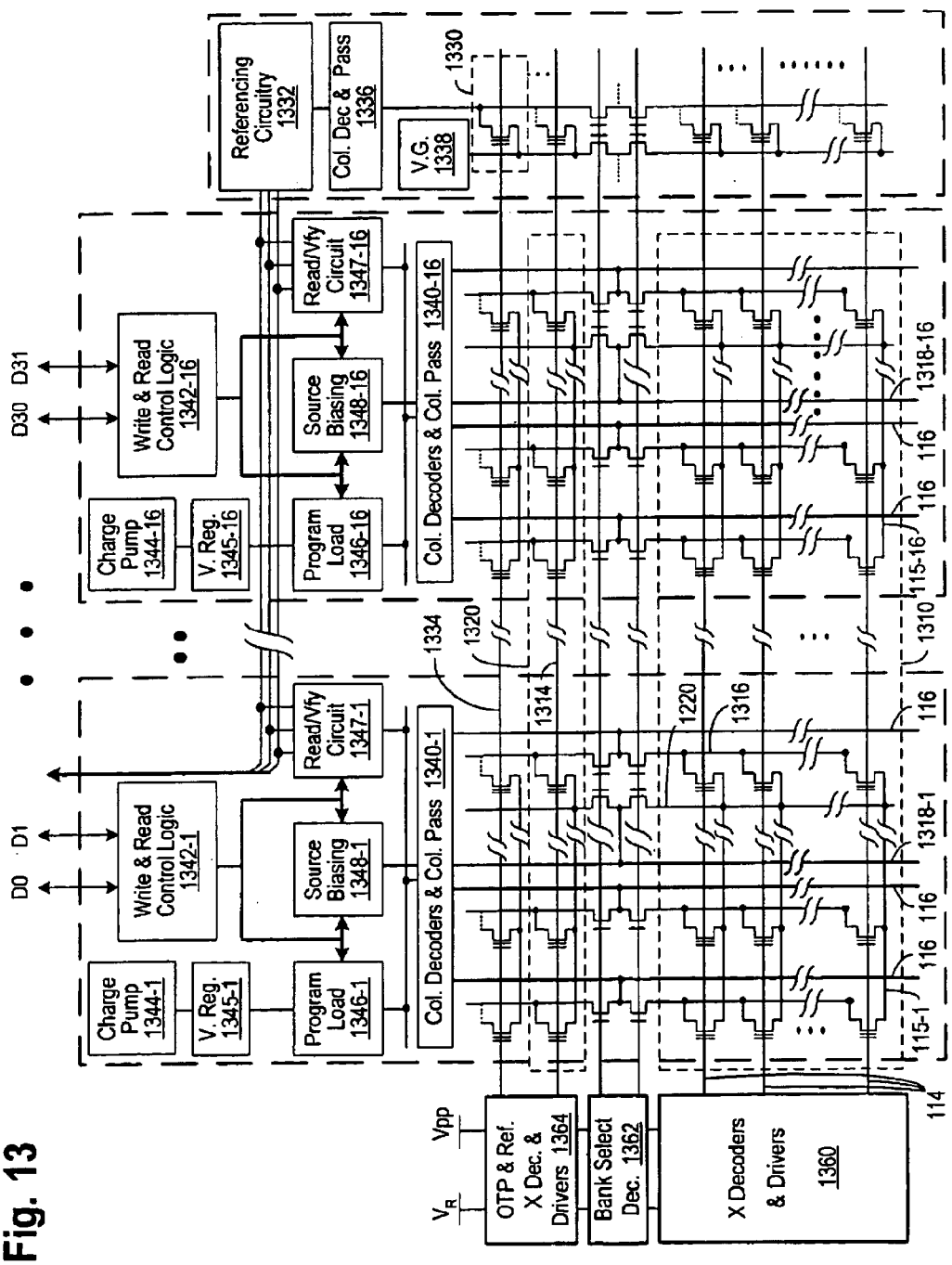
FIG. 13 shows a MBPC Flash memory employing data-dependent source line biasing and data-dependent programming loads during a write operation and having split bit lines.

The divided source line architecture can be used in a memory that employs both multi-bit data-dependent source line biasing and multi-bit data-dependent bit line loads. FIG. 13 shows a Flash memory 1300 in accordance with an embodiment of the invention implementing write operations with both multi-bit data-dependent programming loads and multi-bit data-dependent source line biasing. Memory 1300 contains memory cells that are divided into banks 1310 and 1320. Bank 1310 contains memory cells used for ordinary data storage, and bank 1320 contains one-time programmed (OTP) memory cells that store data written at the factory.

A bank select circuit 1362 selects which bank 1310 or 1320 is accessible. When bank 1310 is selected, X decoders and drivers 1360 activate a word line 114 corresponding to a row of memory cells that is selected for access. When bank 1320 is selected, decoders and drivers 1364 select a word line 1314 corresponding to a row of OTP memory cells that is selected for a read operation. Drivers 1364 also activate a reference word line 1334 regardless of which bank is being accessed during a read or write operation.

Reference memory cells 1330 are externally accessible and are programmed during manufacturing to provide the reference signals required for multi-bit read and write operations. In particular, for a 2-BPC memory using the erased threshold voltage to represent one of the four data values, three reference cells 1320 can be programmed to the target threshold voltages. Sense amplifiers in read/verify circuits 1347-1 to 1347-16 can then compare the current or voltage on a selected bit line 116 to the currents that reference memory cells 1330 draw on reference bit lines. The results of the comparisons during a verify operation indicate whether a memory cell being programmed has reached the target threshold voltage. To generate the reference signals, a virtual ground circuit 1338 grounds the sources of reference cells 1320, and column decoder 1336 connects reference cells 1320 to referencing circuit 1332. Referencing circuitry 1332 can form a current mirror with read/verify circuits 1347-1 to 1347-16.

For a write operation, each write control circuit 1342-1 to 1342-16 receives two bits of 32-bit data signal D[0:31]. Based on the two data bits, each write control circuit 1342-1 to 1342-16 directs a corresponding one of programming loads 1346-1 to 1346-16 and a corresponding one of source biasing circuit 1348-1 to 1348-16 to set the bit line load and the source line biasing to levels corresponding to the two bit data value. Alternatively, the source biasing circuit 1348 can provide a virtual ground signal to metal source lines 1318, which is independent of the multi-bit data. The bit line biasing on each selected bit line 116 will then depend on the programming current through the selected memory cell and the voltage provided by respective charge pumps 1344-1 to 1344-16 and voltage regulators 1345-1 to 1345-16.

Figure 14:
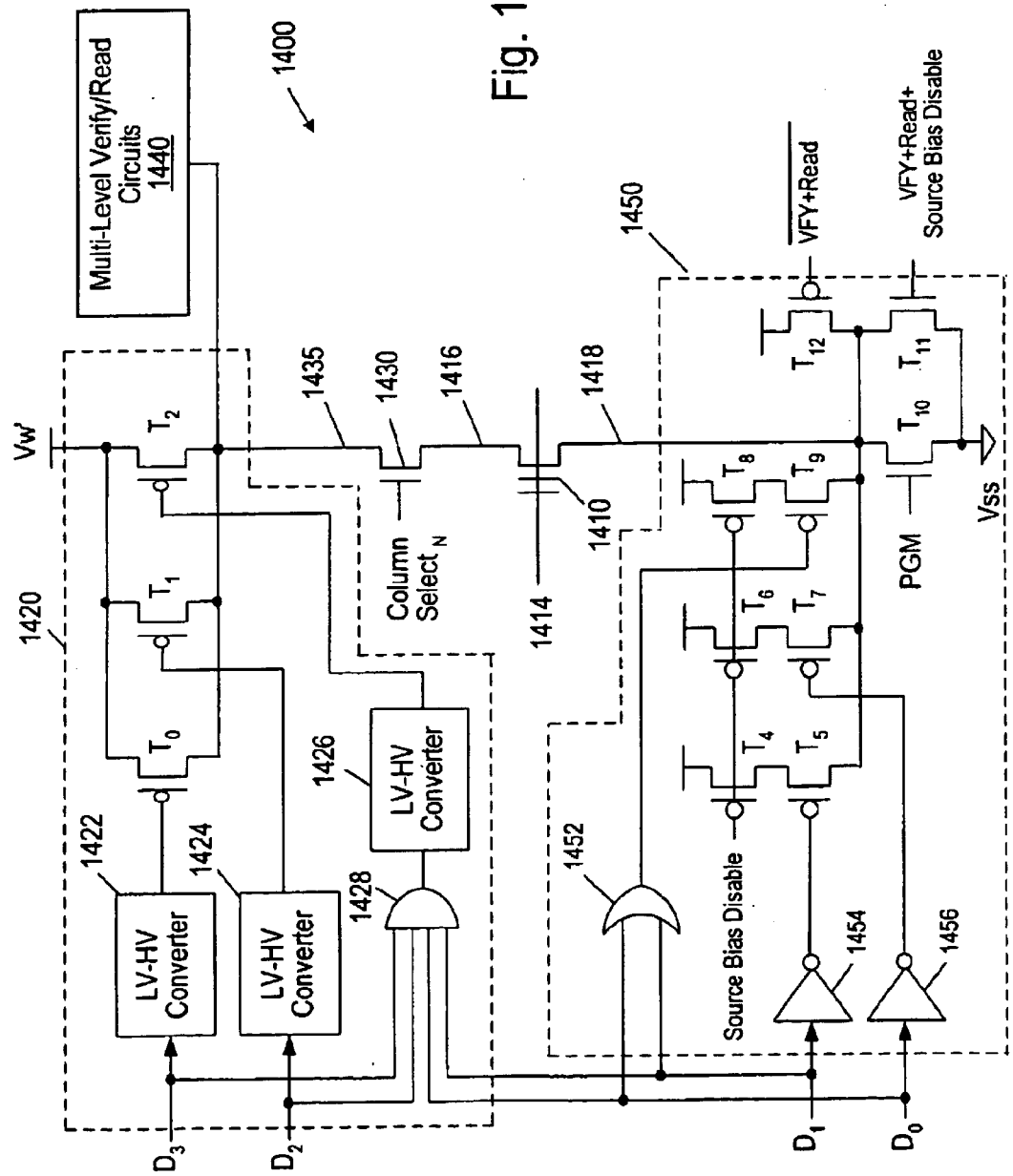
FIG. 14 is a block diagram illustrating elements of programming circuitry including drain and source biasing that depends on a multi-bit data value being written to a selected memory cell.

FIG. 14 shows programming circuitry 1400 that implements multi-bit data-dependent bit line and source line biasing in a 4-BPC memory. FIG. 14 shows only a single memory cell 1410 connected to a shared word line 1414, a bit line 1416, and a source line 1418. In an actual memory, a column of memory cells (not shown) connected to other word lines (not shown) would be connected to the same bit line 1416 and source line 1418. Similarly, word line 1414 is connected to memory cells in a row including multiple memory cells (not shown) being simultaneously programmed. As described above in regards to FIGS. 1 and 2, shared word line 1414 can be either a local or global word line depending on the memory array architecture. Similarly, bit line 1416 and/or source line 1418 can either be local or global lines.

Programming circuitry 1400 includes a variable bit line load 1420 and a variable source line bias circuit 1450. Variable bit line load 1420 is connected to multi-level verify/read circuits 1440. Signals PGM. Source Bias Disable. VFY+Read and VFY+Read+Source Bias Disable control variable source line bias circuit 1450. A full 4-BPC memory would further include at least X similar variable bit line load and source line bias circuits, where X is the number of memory cells simultaneously accessed during a write operation. For memory cell 1410, I/O lines 1435 and a column select device 1430, which is under control of signal Column Select $_N$, connect variable bit line load 1420 to bit line 1416 when a write operation selects memory cell 1410. The source line 1418 of memory cell 1410 is connected to source line bias circuit 1450.

Variable bit line load 1420 contains a set of P-channel transistors T0, T1, and T2 that are connected in parallel between a programming voltage Vw' (e.g., about 5 V) that a charge pump and voltage regulator (not shown) or another high voltage source can supply. Logic including low voltage to high voltage converters 1422, 1424, and 1426, and an AND gate 1428 is connected to activate none, some, or all of transistors T0, T1, and T2, depending on the multi-bit data value being written into memory cell 1410. The sizes of transistors T0, T1, and T2 are selected so that for the expected programming current, a bit line voltage VBL on the drain of memory cell 1410 is either 0 volts, Vw1, Vw2, Vw3, or Vw4 depending on the 4-bit data value [D3:D0] being written to memory cell 1410. Table 2 illustrates the relationship between the data values and bit line voltage VBL in an embodiment of the invention where a 4-BPC memory represents a 4-bit value 1111b using the target lowest threshold Vt0 and a 4-bit value 0000b using the highest target threshold voltage Vt15.

TABLE 2

Data-Dependent Biasing for Programming 4-BPC Memory Cell

| Data Value [D3:D0] | Target Threshold Voltage | $V_{BL}$ | $V_{SL}$ |
|---|---|---|---|
| 0000 | Vt15 | Vw4~4.5 V | VSL1~0.25 V |
| 0001 | Vt14 | Vw4~4.5 V | VSL2~0.5 V |
| 0010 | Vt13 | Vw4~4.5 V | VSL3~0.75 V |
| 0011 | Vt12 | Vw4~4.5 V | VSL4~1.0 V |
| 0100 | Vt11 | Vw3~4.25 V | VSL1~0.25 V |
| 0101 | Vt10 | Vw3~4.25 V | VSL2~0.5 V |
| 0110 | Vt9 | Vw3~4.25 V | VSL3~0.75 V |
| 0111 | Vt8 | Vw3~4.25 V | VSL4~1.0 V |
| 1000 | Vt7 | Vw2~4.0 V | VSL1~0.25 V |
| 1001 | Vt6 | Vw2~4.0 V | VSL2~0.5 V |
| 1010 | Vt5 | Vw2~4.0 V | VSL3~0.75 V |
| 1011 | Vt4 | Vw2~4.0 V | VSL4~1.0 V |
| 1100 | Vt3 | Vw1~3.75 V | VSL1~0.25 V |
| 1101 | Vt2 | Vw1~3.75 V | VSL2~0.5 V |
| 1110 | Vt1 | Vw1~3.75 V | VSL3~0.75 V |
| 1111 | Vt0 | ~0 V | VSL4~1.0 V |

Variable source line bias circuit 1450 connects to source line 1418, which can be a divided source line such as illustrated in FIG. 12B. More generally, each of the selected columns for a write operation has a corresponding source line connected to a corresponding source line bias circuit, and no two memory cells that can be simultaneously accessed have the same source line bias circuit.

Good threshold voltage (Vt) resolution with narrow threshold voltage distribution across the entire array is crucial for high-performance multiple-bit-per-cell memories, but is difficult to achieve especially for continuous word line array architectures in which a large number of cells are programmed simultaneously. The interactions, crosstalk, and couplings among the multiple data path circuitry have an adverse effect on Vt resolution and Vt distribution, similar to the "classical" data-pattern sensitivity effects associated with most semiconductor memories. The fully-independent data path architecture in FIG. 13, consisting of fully-independent write and read control logic 1342, charge pump circuit 1344, voltage regulator circuit 1345, program load circuit 1346, read/verify circuit 1347, source biasing circuit 1348, provides the necessary isolation among the different data paths. FIG. 13 shows one set of reference cells 1330 and referencing circuit 1332 supporting all sixteen read/verify circuits 1347. Alternatively, each read/verify circuit 1347 can have a dedicated set of reference cells 1330 and reference circuit 1332 (not shown) to further improve the isolation among the various data paths.

In the embodiment of FIG. 14, variable source line bias circuit 1450 includes transistors T4 to T9 that are connected to create three pull-up devices and transistors T10 and T11 that act as pull-down devices. During programming, pull-down device T10 is activated, and one or more of the pull-up devices is activated depending on the data value [D3:D0] being written and whether source line biasing is enabled. The illustrated logic includes an OR gate 1452 and inverters 1454 and 1456 that are connected so that if source line biasing is enabled, at least one of the pull-up devices will be active. The source line bias voltage thus depends on the strength of the pull-down devices in source line bias circuit 1450 relative to the strength of the active pull-up device(s) in source line bias circuit 1450 and the combined effective resistance of the memory cell and the bit line load 1420, and when source line biasing is enabled, the data value controls which of the pull-up devices in source line bias circuit 1050 are active. Table 2 above illustrates exemplary levels for source line bias VSL for a 4-BPC memory when source line biasing is enabled. If source line biasing is disabled, for example, for independent virtual grounding or remedial programming cycles, none of the pull-up devices will be active, and source line 1418 will be at the virtual ground level.

FIG. 14 illustrates an embodiment that uses both multi-bit data-dependent bit line biasing and multi-bit data-dependent source line biasing. Alternatively, a MBPC memory may employ only data-dependent bit line biasing or only multi-bit data-dependent source line biasing. An advantage of employing both is the large number of biasing combinations available. For example, four bit line bias voltages Vw1, Vw2, Vw3, and Vw4 combined with four source line bias voltages VSL1, VSL2, VSL3, and VSL4 can provide 16 different biasing combinations for programming memory cells to 16 different target threshold voltage levels, for 4-bit-per-cell memories.

Source line biasing circuit 1450 can also be beneficial in suppressing leakage current through unselected memory cells during verify or read operations. Since a column of memory cells often includes hundreds or thousands of unselected memory cells connected to the same bit line as the selected memory cell, small sub-threshold current flowing through unselected memory cells can combine to make sensing the current through the selected memory cell difficult. A conventional technique for avoiding unacceptably high leakage current limits the range of threshold voltages so that no memory cells have a threshold voltage lower than about 1.5 to 2 volts. With the minimum threshold voltage at this level and grounded control gates for unselected rows, the sub-threshold current through unselected memory cells will not disturb sensing of the current through the selected memory cell. However, if the minimum threshold voltage is below 1.5 V, the combined sub-threshold current through unselected cells (even with grounded control gates) is unacceptably high. A positive source line bias decreases the sub-threshold current so that the memory cells can have lower threshold voltages without disturbing the read or verify operations. The dynamic range of threshold voltages available for storage of data is thus expanded, which is critical to increasing the number of bits of data stored per memory cell in MBPC Flash memories.

A pull-up transistor T12 in source line bias circuit 1450 is activated for read and verify operations to provide a source line bias that decreases sub-threshold leakage current through unselected memory cells. If necessary, the voltage on the selected word line during read operations and verify cycles can be increased to compensate for the source line biasing.

Figure 15:
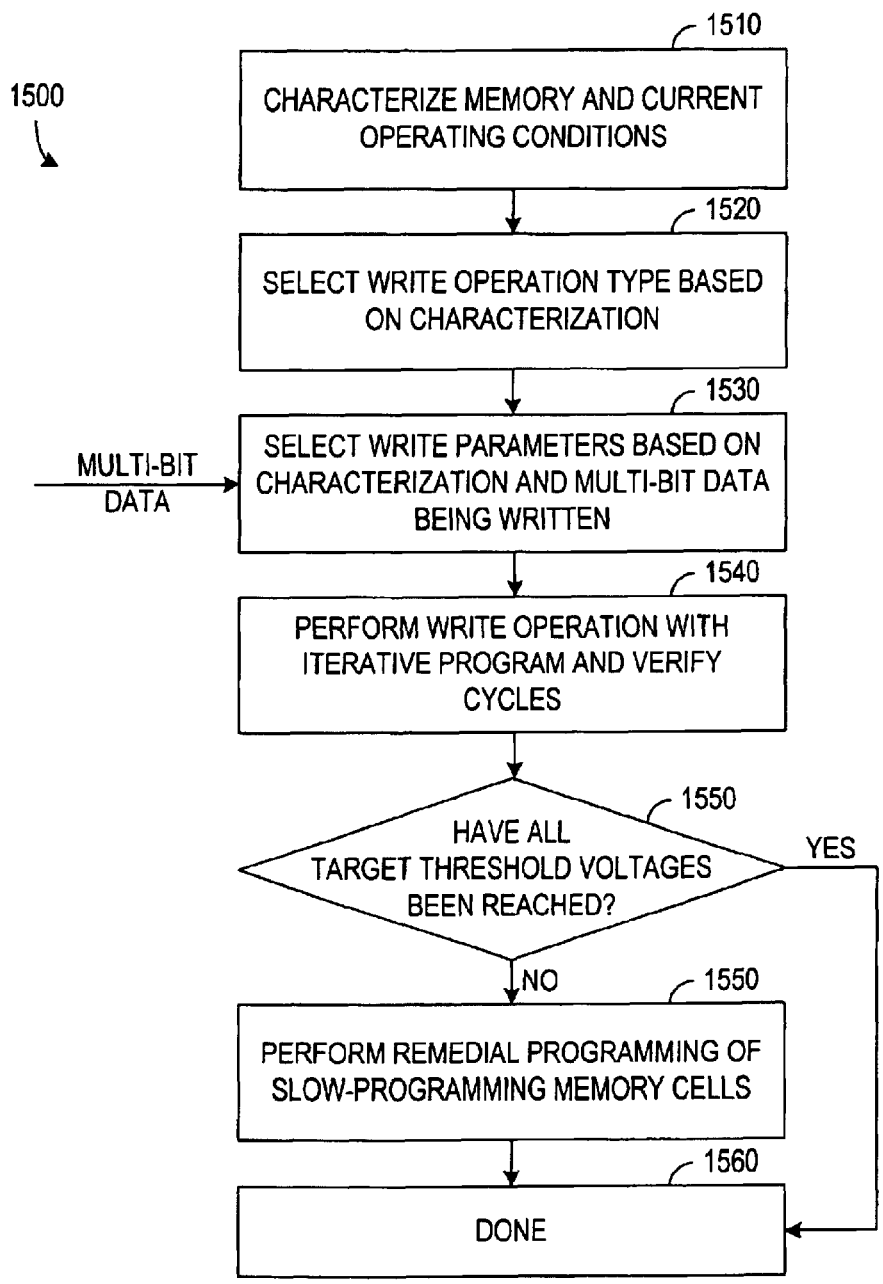
FIG. 15 is a flow chart for an intelligent write state machine in accordance with an embodiment of the invention.

FIG. 15 is a flow diagram of a process 1500 for use of a programmable write state machine in accordance with an embodiment of the invention. Process 1500 begins with the step 1510 of characterizing the memory cells being programmed. Such characterization generally includes information such as manufacturing information, test results, endurance cycling history, current operating conditions, and characteristics from actual programming of available spare or dummy cells in each sector in the array (not shown). The manufacturing information, test results, and endurance cycling history can be stored in one time programmable (OTP) memory such as illustrated in MBPC memory 1320 of FIG. 13. Current operating conditions such as temperature and supply voltage, and characteristics from actual programming of available spare or dummy cells can be monitored or determined during a start-up operation of the memory.

Step 1520 selects a write operation strategy based on the characterizing data. Step 1530 uses the characterizing data and the multi-bit data to select write operation parameters for the write operation as a whole and for individual write circuits. The word line programming voltage Vg and the pulse width of programming cycles are the same for all memory cells that are connected to the shared word line. The bit line programming voltage (or load) and the source line bias can be the same for all memory cells or individually selected for each memory cell depending on the memory architecture and the selected write strategy. The programming of memory cells then proceeds iteratively in step 1540 with each programming cycle being followed by a verify cycle that determines which memory cells have reached their respective target threshold voltages.

After completion of the programming cycles dictated by the write strategy, step 1550 determines whether all memory cells have reached their respective target threshold voltages. If any memory cells failed to reach their target threshold voltages, step 1560 performs remedial programming of the slow programming memory cells.

Although the invention has been described with reference to particular embodiments, the description is only an example of the invention's application and should not be taken as a limitation. Various adaptations and combinations of features of the embodiments disclosed are within the scope of the invention as defined by the following claims.

What is claimed is:

1. A write operation for a multiple-bit-per-cell (MBPC) non-volatile memory, comprising:

applying a first signal to a word line that is connected to multiple selected memory cells that are being simultaneously programmed, wherein the selected memory cells are being programmed to respective target threshold voltages that represent respective multi-bit data values being written; and biasing sources of the selected memory cells to levels selected according to the respective multi-bit data values, wherein the first signal includes programming cycles and verify cycles, and biasing the sources of the selected memory cells to the levels selected according to the multi-bit data values occurs during the programming cycles.

2. The write operation of claim 1, further comprising performing a sensing operation during the verify cycles to determine which of the memory cells have reached the respective target threshold voltages.

3. The write operation of claim 2, wherein the sensing operation comprises biasing to a positive voltage source lines that are connected to unselected memory cells.

4. A write operation for a multiple-bit-per-cell (MBPC) non-volatile memory, comprising applying a write signal to a word line that is connected to multiple selected memory cells that are being simultaneously programmed, wherein the selected memory cells are being programmed to respective target threshold voltages that represent respective multi-bit data values being written, and the write signal includes:

a plurality of programming cycles during which programming voltages applied to the selected memory cells change threshold voltages of the selected memory cells; and a plurality of verify cycles during which sensing operations determine whether the selected memory cells have reached the respective target threshold voltages, wherein the programming cycles have shorter duration at an end of a first interval than at a start of the first interval; increase in duration immediately after the first interval, and for a second interval that follows the first interval have shorter duration at an end of the second interval than at a start of the second interval.

5. The write operation of claim 4, wherein the programming cycles are such that programming of a typical memory cell reaches a first of the target threshold voltages near the end of the first interval and reaches a second of the target threshold voltages near the end of the second interval.

6. The write operation of claim 4, further comprising biasing drains of the selected memory cells to levels selected according to the respective multi-bit data values, wherein the programming cycles are such that programming of a typical memory cell having a drain biased at a first level reaches a first of the target threshold voltages near the end of the first interval, and such that programming of a typical memory cell having a drain biased at a second level reaches a second of the target threshold voltages near the end of the first interval.

7. The write operation of claim 4, further comprising biasing sources of the selected memory cells to levels selected according to the respective multi-bit data values, wherein the programming cycles are such that programming of a typical memory cell having a source biased at a first level reaches a first of the target threshold voltages near the end of the first interval, and such that programming of a typical memory cell having a source biased at a second level reaches a second of the target threshold voltages near the end of the first interval.

8. A write operation for a multiple-bit-per-cell (MBPC) non-volatile memory, comprising applying a write signal to a word line that is connected to multiple selected memory cells that are being simultaneously programmed, wherein the selected memory cells are being programmed to respective target threshold voltages that represent respective multi-bit data values being written, and the write signal includes:

a plurality of programming cycles during which programming voltages applied to the selected memory cells change threshold voltages of the selected memory cells; and a plurality of verify cycles during which sensing operations determine whether the selected memory cells have reached the respective target threshold voltages, wherein a programming voltage applied to the word line during the programming cycles increases in steps of different sizes during the write operation.

9. The write operation of claim 8, wherein the programming voltage increases each programming cycle until the programming voltage reaches a maximum level.

10. The write operation of claim 8, wherein the write operation is partitioned into a series of intervals with each interval corresponding to a different target threshold voltage, and the programming voltage during each interval has a maximum level selected so that a typical memory cell programs to each of the target threshold voltages during the interval corresponding to that target threshold voltage.

11. The write operation of claim 10, wherein the programming voltage is constant during each interval, and increases from one interval to the next.

12. The write operation of claim 10, wherein during each interval, programming cycles have longer duration at the start of the interval than at the end of the interval.

13. A write operation for a multiple-bit-per-cell (MBPC) non-volatile memory, comprising:

performing a write operation on a selected memory cell using a first set of programming parameters for the write operation, wherein the first set of programming parameters are such that the write operation changes a threshold voltage of a typical memory cell to a target threshold voltage;

determining whether the selected memory cell has the target threshold voltage after the write operation; and in response to the selected memory cell not having the target threshold voltage, applying additional programming to the selected memory cell, wherein the additional programming uses a second set of programming parameters that differ from the first set of programming parameters.

14. The write operation of claim 13, wherein the first set of programming parameters includes a first duration for programming cycles during which the threshold voltage of the selected memory cell changes, and the second set of programming parameters includes a second duration for the programming cycles, the second duration being longer than the first duration.

15. The write operation of claim 13, wherein the first set of programming parameters includes a first programming voltage applied to a word line during the write operation, and the second set of programming parameters includes a second programming voltage applied to the word line during the additional programming, the second programming voltage being higher than the first programming voltage.

16. The write operation of claim 13, wherein the first set of programming parameters includes a first programming voltage applied to a bit line during the write operation, and the second set of programming parameters includes a second programming voltage applied to the bit line during the additional programming, the second programming voltage being higher than the first programming voltage.

17. The write operation of claim 16, wherein the first set of programming parameters includes a first programming voltage applied to a source line during the write operation, and the second set of programming parameters includes a second programming voltage applied to the source line during the additional programming, the second programming voltage being lower than the first programming voltage.

18. A multiple-bit-per-cell (MBPC) non-volatile memory, comprising:

an array of memory cells including word lines connected to control gates of memory cells in respective rows of the array, bit lines connected to drains of memory cells in respective columns of the array, and source lines connected to memory cells in respective groups of columns of the array;

a plurality of multilevel write circuits, each multilevel write circuit corresponding to one of the groups of the columns in the memory array;

a column selection circuit that for a write operation connects each multilevel write circuit to a selected one of the bit lines that are connected to the drains of memory cells in one of the columns in the group corresponding to the multilevel write circuit; and a plurality of source line bias circuits respectively coupled to the source lines, wherein for the write operation, each source line bias circuit biases the source line coupled to the source line bias circuit to a voltage that depends on a multi-bit data value being written in a selected one of the memory cells coupled to that source line.

19. The memory of claim 18, wherein the word lines are such that a single selected word line is coupled to a plurality of memory cells being simultaneously programmed during the write operation.

20. The memory of claim 18, wherein each multilevel write circuit comprises a bit line load that permits data-dependent control of a bias voltage applied to the selected bit line during the write operation.

21. A multiple-bit-per-cell (MBPC) non-volatile memory, comprising:

an array of memory cells including word lines connected to control gates of memory cells in respective rows of the array, bit lines connected to drains of memory cells in respective columns of the array, and source lines connected to memory cells in respective groups of columns of the array;

a plurality of multilevel write circuits, each multilevel write circuit corresponding to one of the groups of the columns in the memory array, wherein each multilevel write circuit is isolated from the other multilevel write circuits for performing parallel write operations; and a column selection circuit that for a write operation connects each multilevel write circuit to a selected one of the bit lines that are connected to the drains of memory cells in one of the columns in the group corresponding to the multilevel write circuit.

22. The memory of claim 21, further comprising a plurality of charge pump circuits respectively connected to the multilevel write circuits, wherein each multilevel write circuit employs a different one of the charge pump circuits to provide a programming current during writing of a multi-bit value to a selected one of the memory cells.

* * * * *